(12) United States Patent
Forrest et al.

(10) Patent No.: US 11,374,172 B2
(45) Date of Patent: Jun. 28, 2022

(54) ORGANIC VAPOR JET DEPOSITION USING AN EXHAUST

(75) Inventors: Stephen Forrest, Ann Arbor, MI (US); Richard Lunt, Ann Arbor, MI (US)

(73) Assignees: The Regents of the University of Michigan, Ann Arbor, MI (US); The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 12/974,070

(22) Filed: Dec. 21, 2010

(65) Prior Publication Data

US 2011/0088621 A1 Apr. 21, 2011

Related U.S. Application Data

(62) Division of application No. 11/643,795, filed on Dec. 22, 2006, now Pat. No. 7,879,401.

(51) Int. Cl.
| | | |
|---|---|---|
| *C23C 14/12* | (2006.01) | |
| *C23C 16/455* | (2006.01) | |
| *C23C 16/44* | (2006.01) | |
| *C23C 14/24* | (2006.01) | |
| *H01L 51/00* | (2006.01) | |

(52) U.S. Cl.
CPC .......... *H01L 51/0008* (2013.01); *C23C 14/12* (2013.01); *C23C 14/24* (2013.01); *C23C 16/4412* (2013.01); *C23C 16/4551* (2013.01); *C23C 16/45561* (2013.01); *C23C 16/45563* (2013.01); *C23C 16/45574* (2013.01)

(58) Field of Classification Search
CPC ..... H01L 51/0008; C23C 14/12; C23C 14/24; C23C 16/4551; C23C 16/45563; C23C 16/4412; C23C 16/45574; C23C 16/45561

USPC .......................................................... 118/715
See application file for complete search history.

(56) References Cited

U.S. PATENT DOCUMENTS

| | | | | |
|---|---|---|---|---|
| 4,263,088 A | * | 4/1981 | Gorin | H01J 37/32935 204/192.32 |
| 4,533,410 A | * | 8/1985 | Ogura | C23C 16/45561 117/99 |
| 4,579,618 A | * | 4/1986 | Celestino | H01J 37/32 156/345.34 |

(Continued)

FOREIGN PATENT DOCUMENTS

| | | | | |
|---|---|---|---|---|
| JP | 2004103630 A | * | 4/2004 | |
| WO | WO 9925894 | * | 5/1999 | |

(Continued)

OTHER PUBLICATIONS

Shtein et al, Apr. 1, 2003, Journal of Applied Physics, Volume, vol. 93, No. 7.*

(Continued)

*Primary Examiner* — Jeffrie R Lund
(74) *Attorney, Agent, or Firm* — Riverside Law LLP

(57) ABSTRACT

Methods and systems for organic vapor jet deposition are provided, where an exhaust is disposed between adjacent nozzles. The exhaust may reduce pressure buildup in the nozzles and between the nozzles and the substrate, leading to improved deposition profiles, resolution, and improved nozzle-to-nozzle uniformity. The exhaust may be in fluid communication with an ambient vacuum, or may be directly connected to a vacuum source.

28 Claims, 34 Drawing Sheets

(56) References Cited

U.S. PATENT DOCUMENTS

| | | | |
|---|---|---|---|
| 4,992,303 A * | 2/1991 | Whiffin | C23C 16/45561 257/E21.463 |
| 5,014,646 A * | 5/1991 | Ito | C23C 16/045 118/50.1 |
| 5,122,394 A * | 6/1992 | Lindner | C03C 17/002 118/718 |
| 5,164,363 A * | 11/1992 | Eguchi | C23C 16/408 427/126.3 |
| 5,356,673 A | 10/1994 | Schmidtt | |
| 5,445,699 A * | 8/1995 | Kamikawa et al. | 156/345.24 |
| 5,614,026 A * | 3/1997 | Williams | C23C 16/4412 118/723 ER |
| 5,703,436 A | 12/1997 | Forrest et al. | |
| 5,707,745 A | 1/1998 | Forrest et al. | |
| 5,844,363 A | 12/1998 | Gu et al. | |
| 5,863,337 A * | 1/1999 | Neuman | C03C 17/002 118/718 |
| 5,871,586 A * | 2/1999 | Crawley | C30B 25/14 118/715 |
| 5,958,140 A * | 9/1999 | Arami | C23C 16/45574 118/725 |
| 5,976,261 A * | 11/1999 | Moslehi | C23C 16/45574 118/719 |
| 6,013,982 A | 1/2000 | Thompson et al. | |
| 6,017,395 A * | 1/2000 | Matuno | C23C 16/45557 118/715 |
| 6,087,196 A | 7/2000 | Sturm et al. | |
| 6,089,184 A * | 7/2000 | Kaizuka | C23C 16/18 118/723 VE |
| 6,110,531 A * | 8/2000 | Paz de Araujo | B05D 1/00 427/255.25 |
| 6,143,081 A * | 11/2000 | Shinriki | C23C 16/405 118/715 |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,808,741 B1 * | 10/2004 | McLeod | G11B 5/8408 427/131 |
| 6,821,563 B2 * | 11/2004 | Yudovsky | 427/248.1 |
| 7,061,011 B2 | 6/2006 | Forrest et al. | |
| 7,431,968 B1 | 10/2008 | Shtein et al. | |
| 7,452,827 B2 * | 11/2008 | Gianoulakis | C23C 16/4412 257/E21.161 |
| 7,879,401 B2 * | 2/2011 | Forrest | C23C 14/12 427/255.28 |
| 7,976,631 B2 * | 7/2011 | Burrows | C23C 16/45578 156/345.33 |
| 8,659,896 B2 * | 2/2014 | Dede | H05K 7/20927 165/80.4 |
| 9,114,413 B1 * | 8/2015 | Gomez | B05B 5/0533 |
| 9,534,724 B2 * | 1/2017 | Jiang | C23C 16/45517 |
| 11,201,288 B2 * | 12/2021 | Xu | B05B 12/18 |
| 2001/0002279 A1 * | 5/2001 | Forrest | C23C 14/568 427/255.26 |
| 2001/0006070 A1 * | 7/2001 | Shang | C23C 16/4404 134/1 |
| 2001/0007244 A1 * | 7/2001 | Matsuse | C23C 16/45574 118/719 |
| 2002/0000195 A1 * | 1/2002 | Bang | C23C 16/401 118/715 |
| 2004/0048000 A1 | 3/2004 | Shtein et al. | |
| 2004/0050328 A1 * | 3/2004 | Kumagai | H01J 37/32449 118/715 |
| 2004/0056915 A1 * | 3/2004 | Miyazawa | 347/19 |
| 2004/0099213 A1 * | 5/2004 | Adomaitis | C23C 16/52 118/715 |
| 2004/0139914 A1 * | 7/2004 | Yamazaki et al. | 118/719 |
| 2004/0216668 A1 * | 11/2004 | Lindfors | C23C 16/4412 118/715 |
| 2005/0016463 A1 * | 1/2005 | Hirano | C23C 14/048 118/726 |
| 2005/0087131 A1 * | 4/2005 | Shtein et al. | 118/715 |
| 2005/0092248 A1 * | 5/2005 | Lee | C23C 16/45565 118/715 |
| 2005/0284370 A1 * | 12/2005 | Strang | 118/715 |
| 2006/0021574 A1 * | 2/2006 | Armour | C23C 16/45565 118/715 |
| 2006/0201428 A1 * | 9/2006 | Park | C23C 16/45574 118/715 |
| 2006/0234514 A1 * | 10/2006 | Gianoulakis et al. | 438/758 |
| 2006/0279204 A1 | 12/2006 | Forrest et al. | |
| 2007/0148349 A1 * | 6/2007 | Fukada | H01L 21/31691 427/248.1 |
| 2007/0289604 A1 * | 12/2007 | Fukunaga et al. | 134/3 |
| 2008/0050521 A1 * | 2/2008 | Ma | C23C 14/12 427/248.1 |
| 2008/0124463 A1 * | 5/2008 | Bour | C23C 16/45574 427/255.28 |
| 2008/0152806 A1 * | 6/2008 | Forrest | C23C 14/12 427/255.26 |
| 2008/0233287 A1 * | 9/2008 | Shtein et al. | 427/255.6 |
| 2008/0317956 A1 * | 12/2008 | Reber | C23C 16/545 427/255.28 |
| 2009/0250008 A1 * | 10/2009 | Matsushima | C23C 16/45565 118/728 |
| 2009/0304924 A1 * | 12/2009 | Gadgil | C23C 16/4412 427/255.5 |
| 2010/0003405 A1 * | 1/2010 | Kappeler | C30B 25/14 427/255.28 |
| 2011/0045196 A1 * | 2/2011 | Forrest | C23C 14/12 427/427.4 |
| 2011/0088621 A1 * | 4/2011 | Forrest | C23C 14/12 118/715 |

FOREIGN PATENT DOCUMENTS

| | | | |
|---|---|---|---|
| WO | WO 03/020999 | * | 3/2003 |
| WO | WO 03/020999 A1 | * | 3/2003 |

OTHER PUBLICATIONS

English translation of JP2004103630A.*
Handbook of Deposition Technologies for Films and Coatings: Science, Applications and Technology 103 (Peter M Martin, ed., 2010).*
Shtein et al., "Direct mask-free patterning of molecular organic semiconductors using organic vapor jet printing", 2004. J. Appl. Phys. 96(8):4500-4507.
PCT International Search Report and Written Opinion for PCT/US2007/023910 dated Jul. 3, 2008.

* cited by examiner

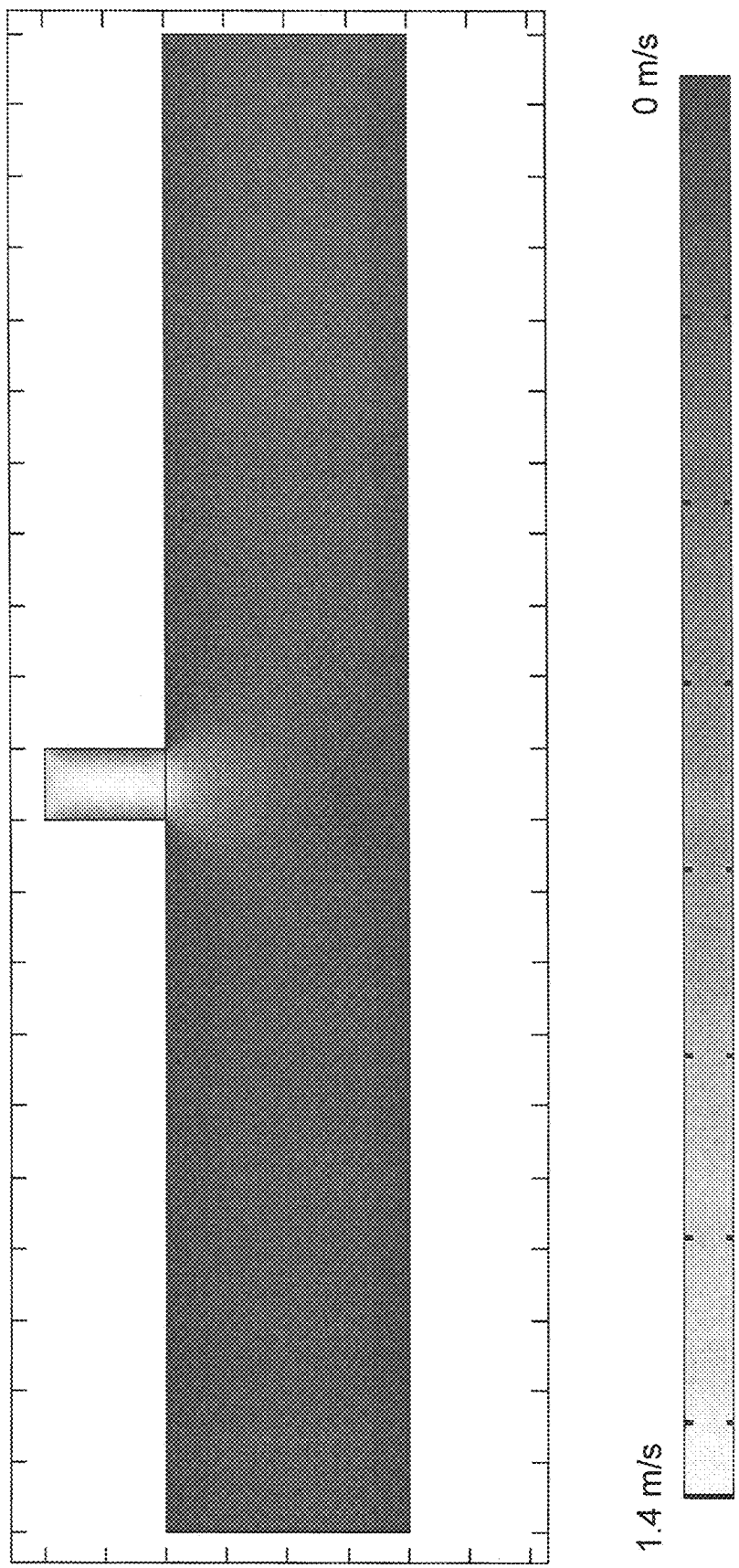

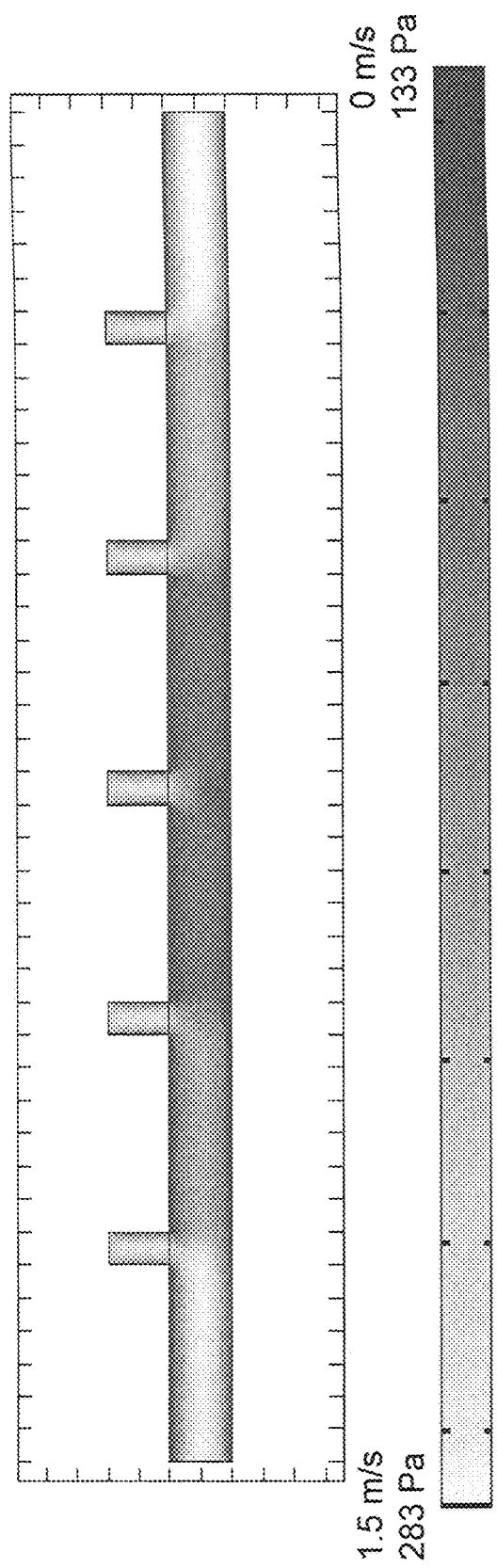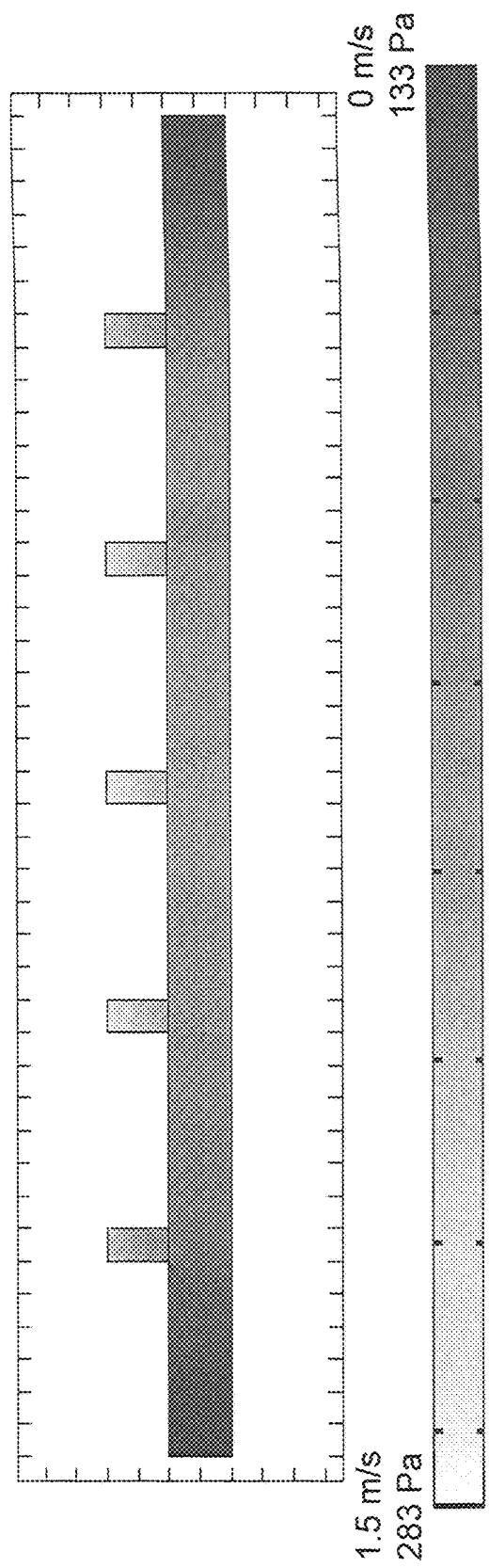
FIG. 14A
FIG. 14B

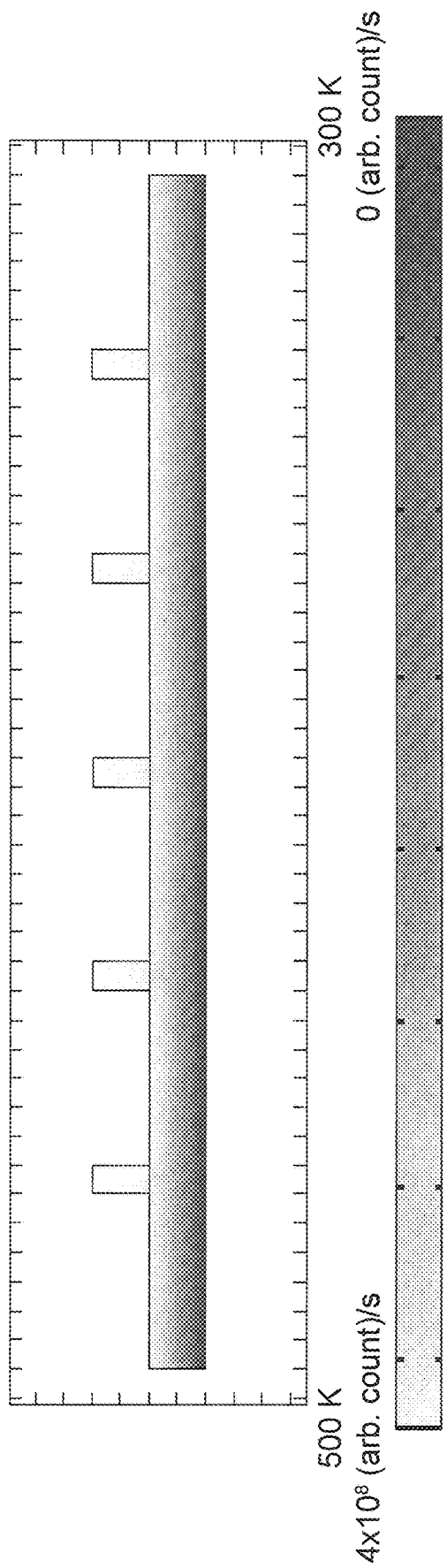

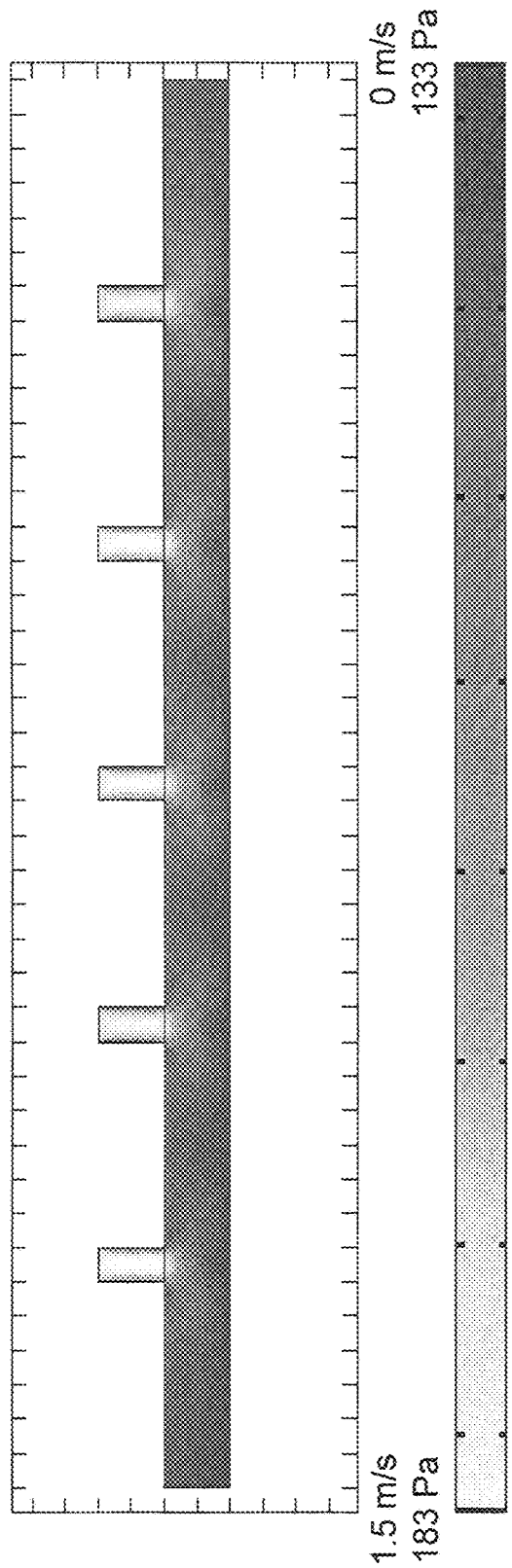
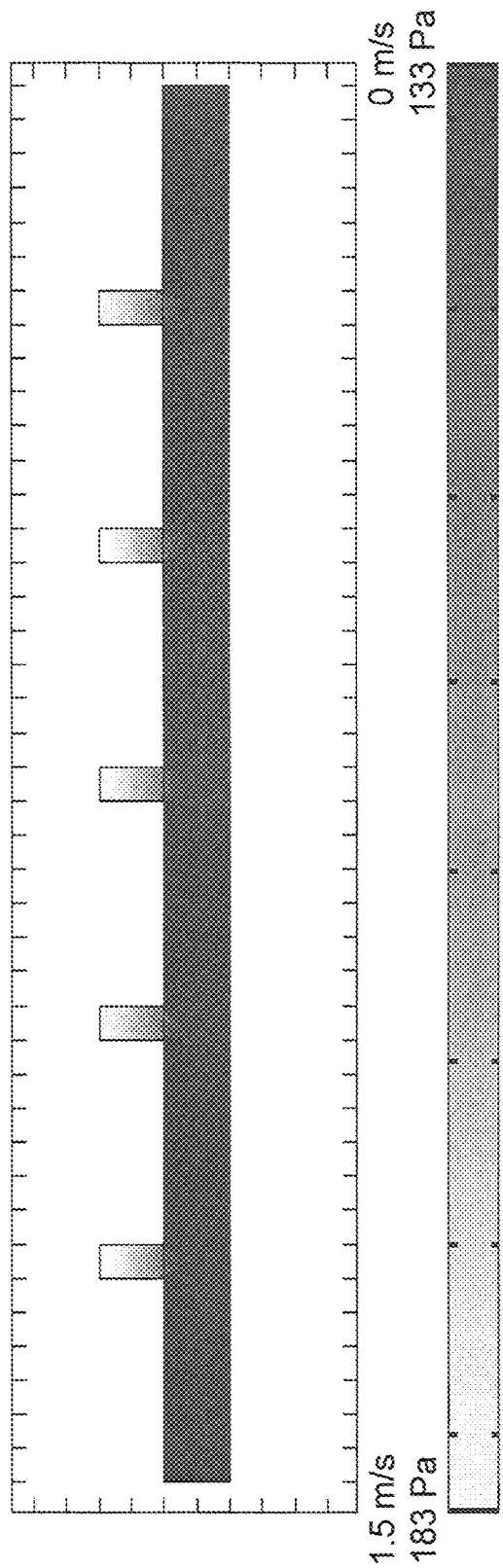

ORGANIC VAPOR JET DEPOSITION USING AN EXHAUST

This application is a divisional of U.S. application Ser. No. 11/643,795, filed on Dec. 22, 2006, the disclosure of which is incorporated by reference in its entirety.

GOVERNMENT RIGHTS

This invention was made with U.S. Government support under Contract No. DE-FC26-04NT42273 awarded by DOE SSL. The government has certain rights in this invention.

JOINT RESEARCH AGREEMENT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to systems and methods for deposition of materials onto substrates utilizing organic vapor jet deposition.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

Systems and methods for OVJD are provided where an exhaust is present between adjacent nozzles. It is believed that the exhaust reduces pressure in the region of the nozzle openings and between the nozzles and substrate, leading to improved resolution and deposition profiles. The exhaust may be in fluid communication with ambient vacuum, such as the vacuum created within a vacuum chamber. It may also be directly connected to a vacuum source.

BRIEF DESCRIPTION OF THE DRAWINGS

FIGS. 10A-10D show simulation results for the velocity, pressure, temperature, and total flux, respectively, for a simulation of a single nozzle system without an exhaust.

FIGS. 14A-14C show the velocity, pressure, and temperature, respectively, for a simulation of multiple nozzles ejecting different materials, without an exhaust disposed between adjacent nozzles.

FIG. 14D shows the total flux for Material 1 in the same simulation illustrated in FIGS. 14A-14C.

FIGS. 16A-16C show the velocity, pressure, and temperature for a simulation of multiple nozzles ejecting different materials, with an exhaust disposed between adjacent nozzles.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

A more detailed description of OLEDs can be found in U.S. Pat. No. 7,061,011 to Forrest et al., and U.S. Patent Application Pub. No. 2006/0279204 to Forrest et al., each of which is incorporated by reference in its entirety.

Figure 1:
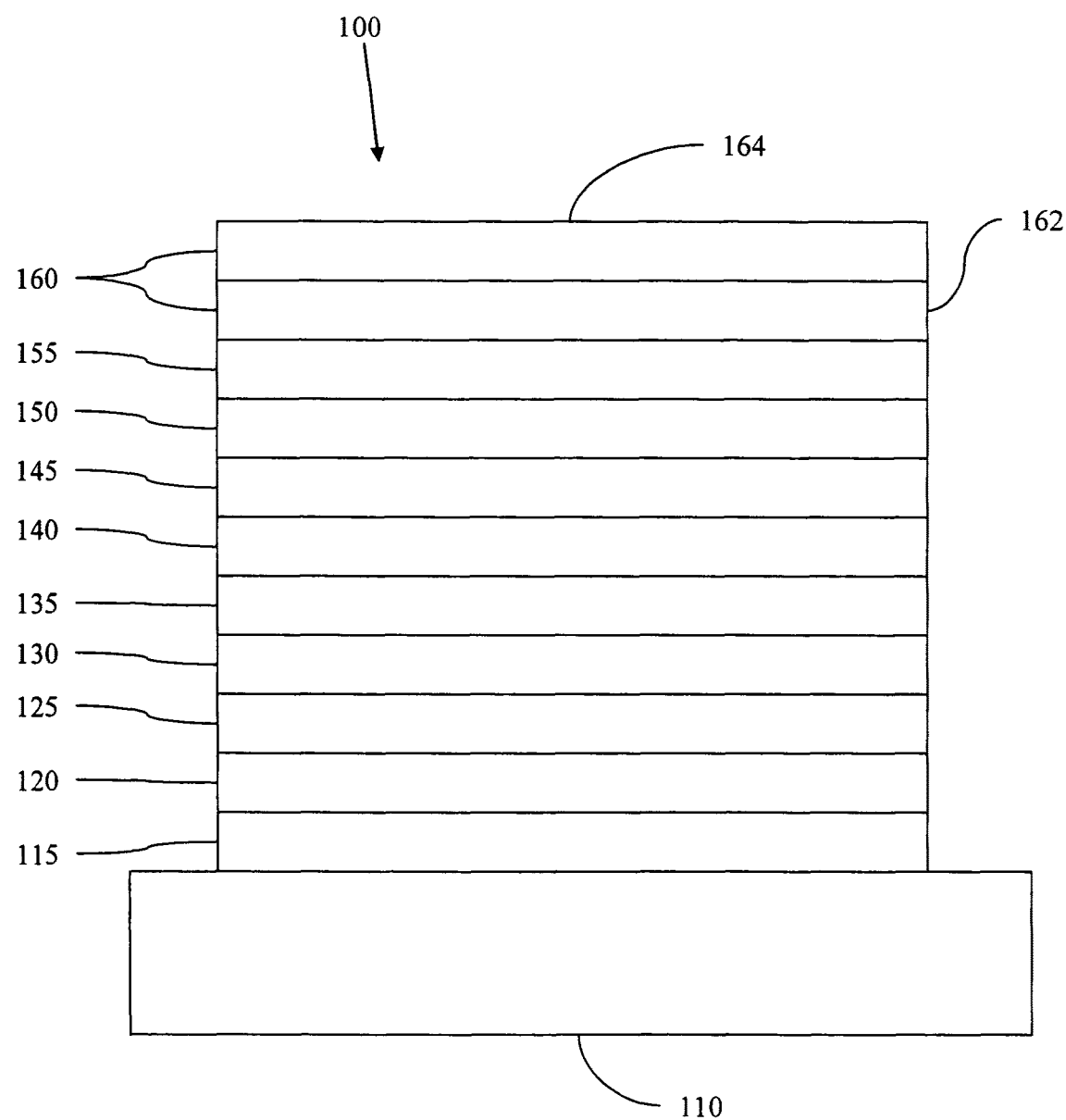
FIG. 1 shows an organic light emitting device having separate electron transport, hole transport, and emissive layers, as well as other layers.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Figure 2:
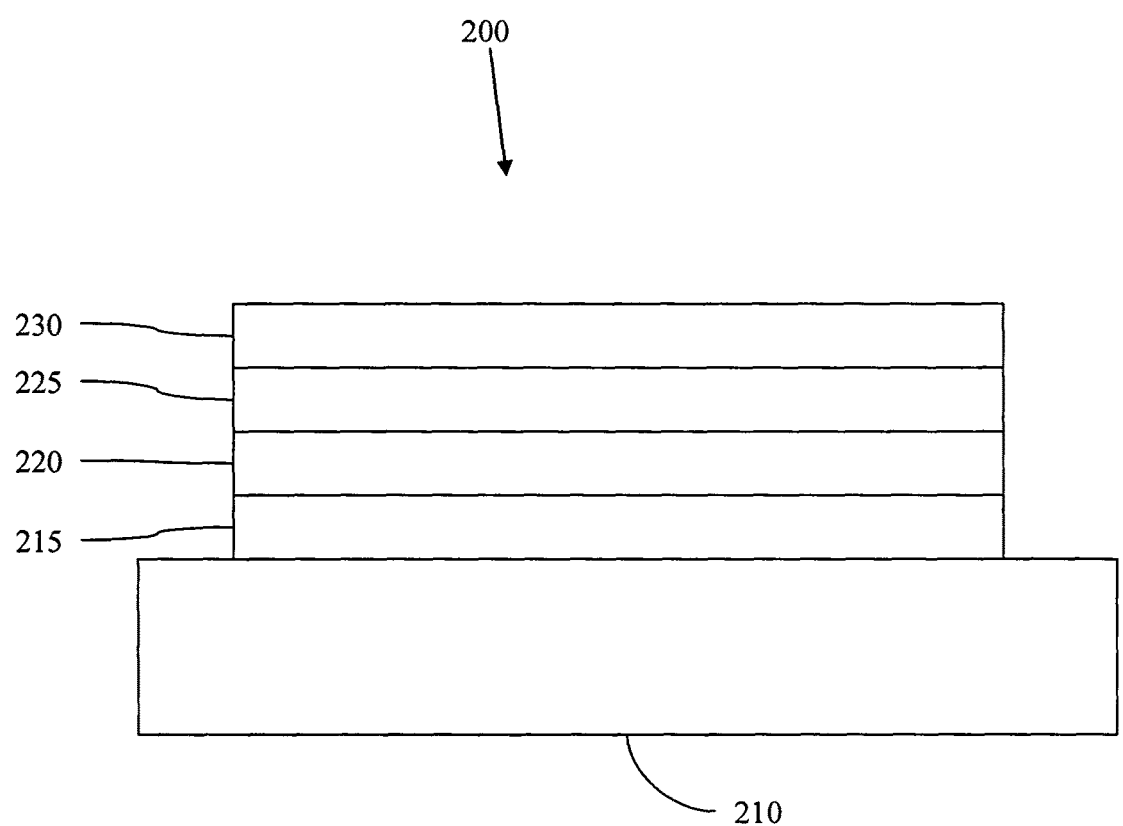
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

Generally, the layers of an OLED between the anode and the cathode are organic. Examples of materials for the anode include ITO, IZO, and AlZnO. Examples of materials for the cathode include ITO, IZO, and Mg:Ag with ITO. Examples of organic materials for the hole transport layer include α-NPD, TPD, and m-MTDATA doped with $F_4$-TCNQ. Examples of organic materials for the emissive layer include Ir(ppy)$_3$, DCM, DMQA, Alq$_3$, CBP, and mCP. Additional details and examples are provided in U.S. Pat. No. 6,303,238 to Thompson et al., which is incorporated by reference in its entirety. Examples of organic materials for the electron transport layer include Alq$_3$ and BPhen doped with Li. Examples of organic materials for the hole injection layer include CuPc, PEDOT:PSS, and MTDATA. Examples of organic materials for the protective layer include CuPc, BCP, and metal phthalocyanines. Many other organic materials are known in the art for use in the various layers of an OLED, and may be used with the concepts and devices described herein.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

One method of depositing the layers in an OLED or other similar device is organic vapor jet deposition (OVJD), in which one or more nozzles are used to direct a flow of carrier gas and organic vapor toward a substrate. OVJD is described in further detail in U.S. patent application Ser. No. 10/233,470, filed Sep. 4, 2002, and Ser. No. 10/422,269, filed Apr. 23, 2003, the disclosure of each of which is incorporated by reference in its entirety.

When OVJD is used to deposit a patterned layer, such as a patterned layer of pixels, it may be desirable to control the area in which material is deposited by each nozzle. For example, when depositing a layer of pixels it is desirable for each pixel to have the same shape and area; it is generally undesirable for deposited material to extend beyond the area in which a pixel is to be deposited. As a specific example, if different materials are ejected from adjacent nozzles, such as when a full-color pixel is to be created by depositing a red, green, and blue pixel in an adjacent region, it may be desirable for the different materials not to mix or overlap as they are deposited. When particles of carrier gas and/or organic vapor are ejected from one or more nozzles in OVJD, they may be ejected in a range of velocities, some of which may not be exactly perpendicular to the substrate or other layer on which the organic material is to be deposited. This can result in "spreading" of the deposited material—i.e., material being deposited in undesirable areas of the substrate.

Figure 3A:
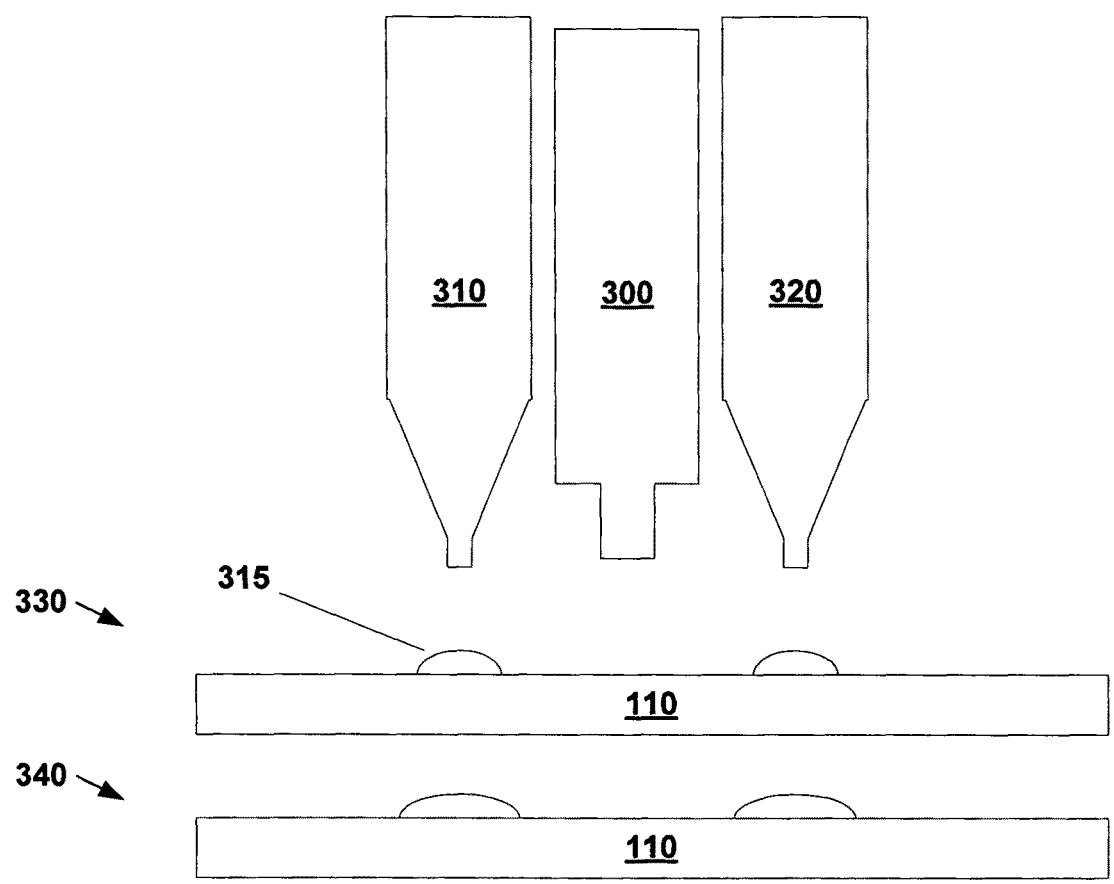
FIG. 3 is a side view of an OVJD apparatus having an exhaust disposed adjacent to deposition nozzles.
Figure 3B:
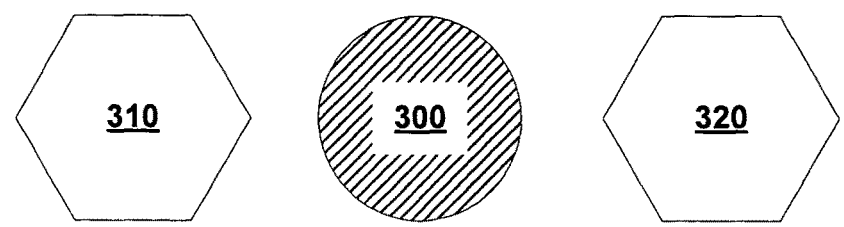

To reduce or prevent such spreading, an exhaust may be placed adjacent to the deposition nozzles. FIGS. 3A-3B shows one such configuration. An exhaust 300 is disposed adjacent to a first nozzle 310 and a second nozzle 320. As explained below, the exhaust 300 may be in fluid communication with a vacuum source, such as an evacuation source for a vacuum chamber or an independent vacuum source. It may also be in fluid communication with ambient vacuum, such as where the apparatus is disposed within a vacuum chamber. Material may be ejected from the nozzles 310, 320 toward the substrate 110 and deposited in desired regions 315. It is believed that the exhaust 300 reduces pressure in the region of the nozzle exits and between the nozzles and the substrate by creating a localized vacuum between the nozzles, providing increased resolution and control over the deposition area. The deposited material may therefore have a resolution profile 330. For comparison purposes, an example deposition profile 340 that might result in the absence of the exhaust is also shown.

FIG. 3B shows a schematic top view of the nozzles and exhaust illustrated in FIG. 3A. When an exhaust 300 is disposed adjacent to two nozzles 310, 320 in the manner shown in FIGS. 3A-3B, it may be described as "between" the two nozzles.

When an exhaust is disposed next to one or more nozzles, it may create a localized vacuum in a region near the nozzle(s). As used herein, a "localized vacuum" refers to an area of lower pressure than surrounding or ambient regions. Thus, even if the exhaust and nozzles are operated in, for example, a vacuum chamber, a localized vacuum may be created between the nozzles. This effect may occur even if the exhaust connects to the ambient vacuum, since higher pressure will be created by ejection of material from the nozzles. In configurations where the exhaust is connected to a vacuum source, the strength of the vacuum source may be adjusted to adjust the degree of the localized vacuum formed.

To perform OVJD, a non-reactive carrier gas transporting an organic vapor is ejected from the nozzles 310, 320. As used herein, a "non-reactive" carrier gas will be understood to refer to a gas that does not react with the material being carried and/or deposited under the conditions normally associated with organic vapor deposition. The carrier gas and organic vapor impinge the surface of the substrate 110 and a thin layer of the organic material is deposited on the substrate. The exhaust 300 creates a localized vacuum between the nozzles, which may reduce the pressure in the regions through which the organic material travels and is deposited on the substrate. This may lead to an improved deposition profile. In configurations where the exhaust is in fluid communication with a vacuum source, the vacuum source may be activated to provide the localized vacuum.

Figure 4A:
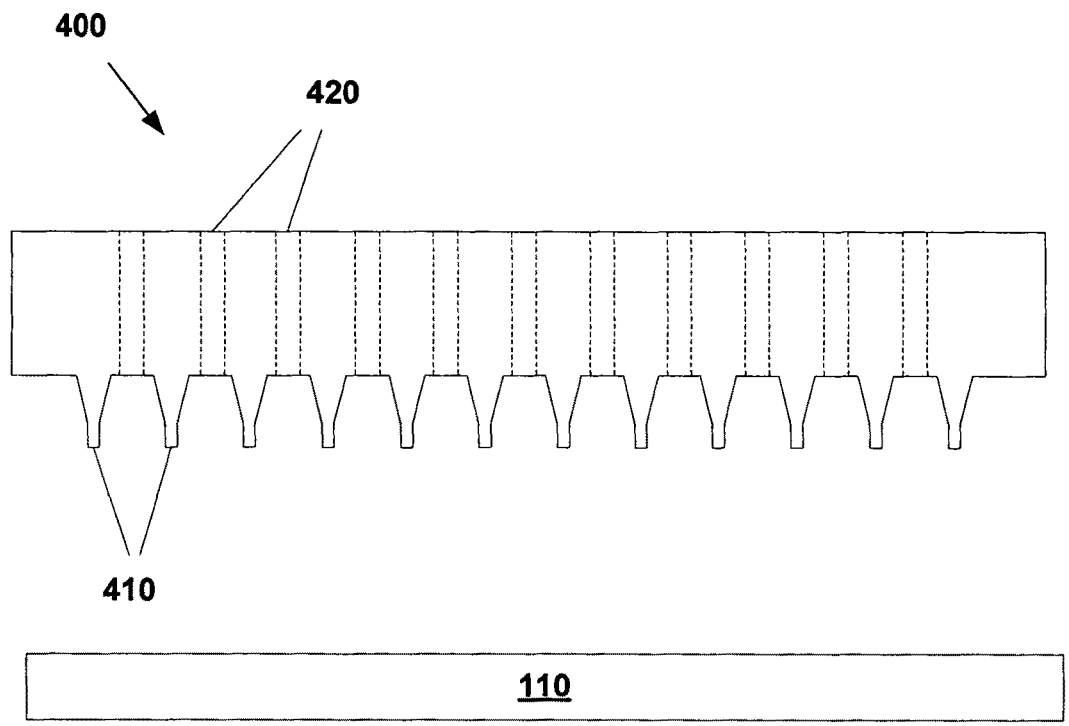
FIG. 4A is a schematic front view of an OVJD apparatus having an exhaust disposed in a nozzle block.

In some configurations, a nozzle block having a plurality of nozzles may be used, as shown in FIG. 4A. Nozzles 410 are arranged in a desired configuration within the nozzle block 400. One or more exhausts 420 may also be disposed in the nozzle block. For example, the exhausts 420 may be passages extending through the otherwise solid nozzle block 400, thus connecting the region between adjacent nozzles to the ambient vacuum. The exhausts 420 may also be in fluid communication with or directly connected to a vacuum source.

Figure 4B:
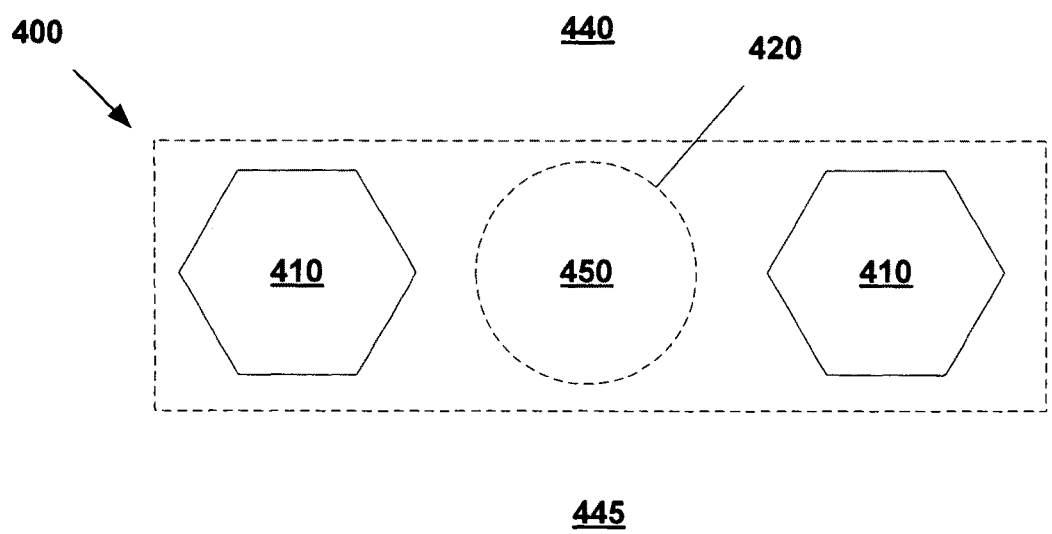
FIG. 4B is a schematic top view of a nozzle block having two nozzles and an exhaust.
Figure 4C:
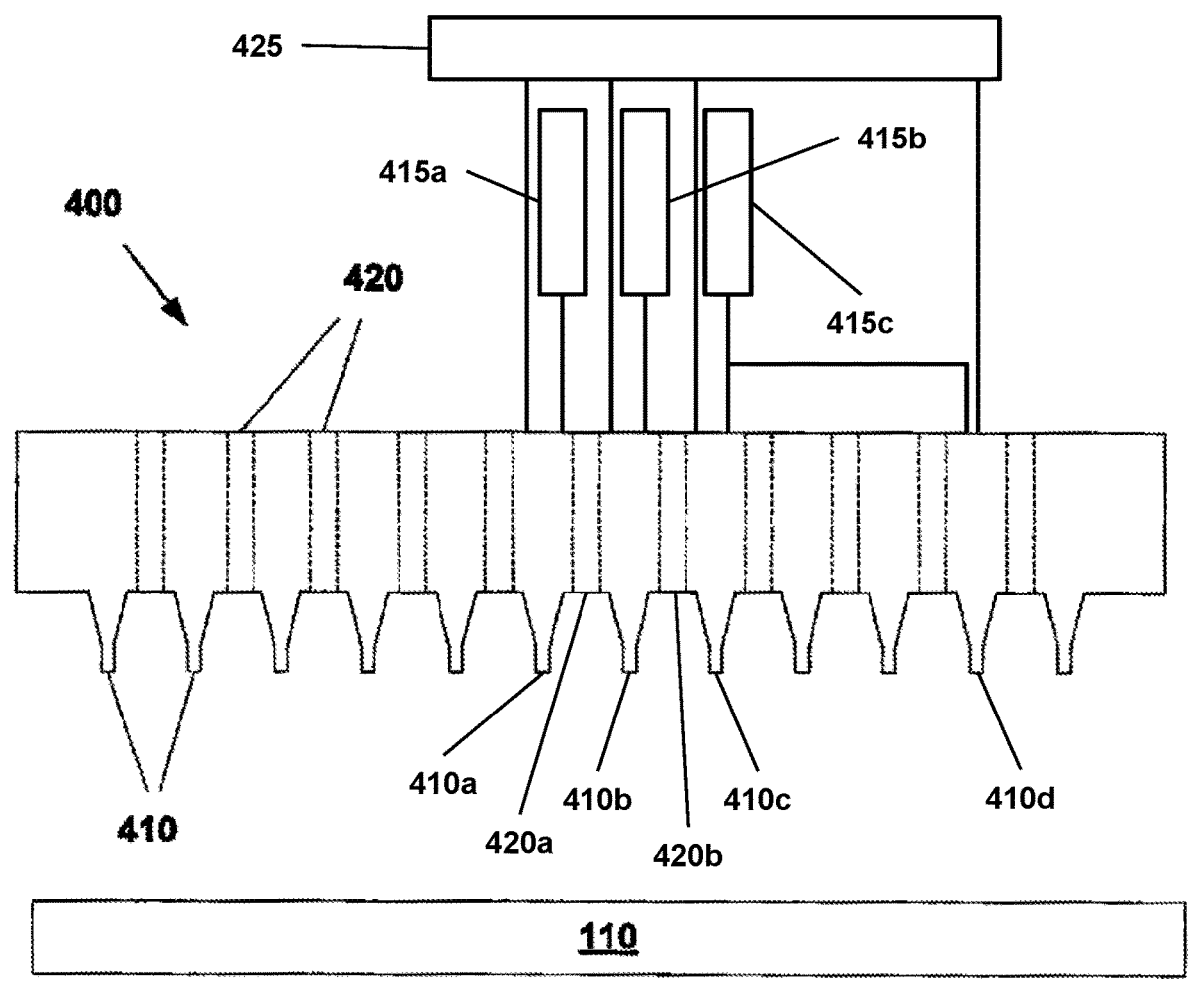
FIG. 4C is a schematic front view of an OVJD apparatus having an exhaust disposed in a nozzle block and an exemplary configuration of sources of material and carrier gas.

In some configurations, such as the full-color pixel configuration discussed above, a nozzle block having a plurality of material sources and a carrier gas source may be used as shown in FIG. 4C. First, second, and third nozzles 410a, 410b, and 410c may for example be arranged with exhausts 420a and 420b positioned between them. In the depicted example, first nozzle 410a is in fluid communication with first source of material 415a, second nozzle 410b is in fluid communication with second source of material 415b, and third nozzle 410c is in fluid communication with third source of material 415c. Further, in the depicted embodiment, all three nozzles 410a, 410b, and 410c are in fluid communication with a common source of carrier gas 425. In some embodiments, the nozzles may be arranged in a repeating pattern. For example, nozzle 410d may also be connected to third source of material 415c, with the two nozzles between nozzle 410c and 410d fluidly connected to first and second sources of material 415a and 415b, respectively. In one exemplary embodiment, the three sources of material 415a, 415b, and 415c may be selected from red, green, and blue organic emissive material.

Figure 5A:
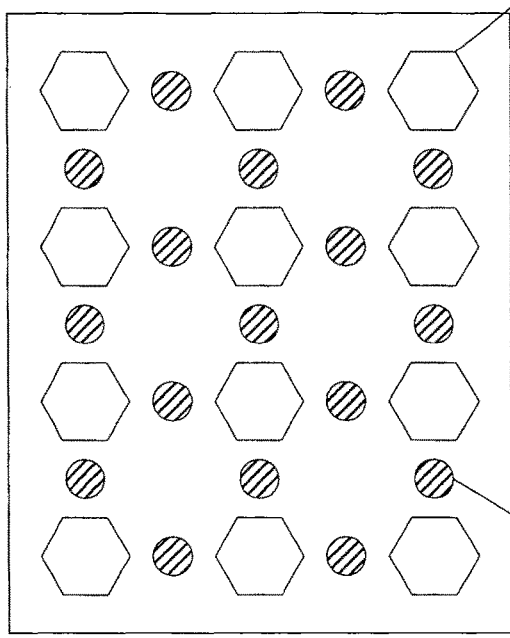
FIGS. 5A-5F show schematic top views of exemplary configurations of nozzles and exhausts in a nozzle block.
Figure 5B:
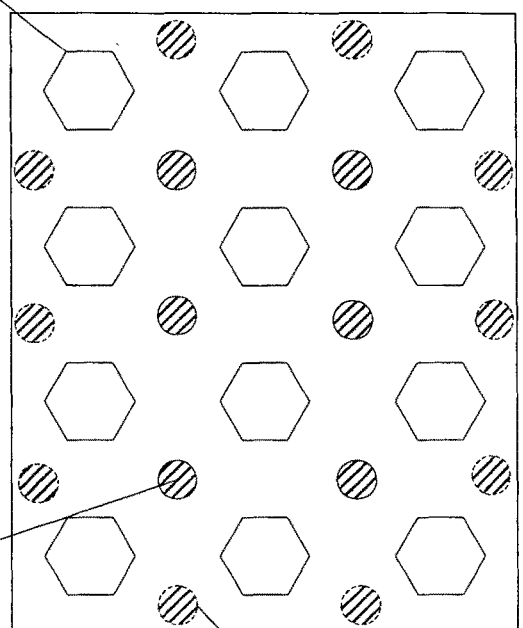
Figure 5C:
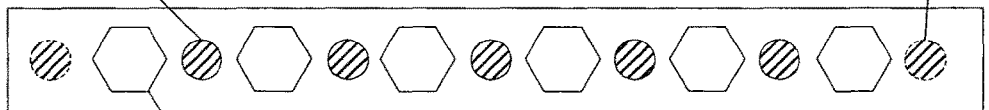
Figure 5D:
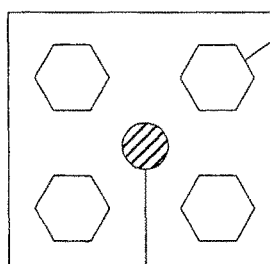
Figure 5E:
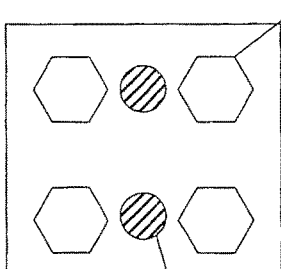
Figure 5F:
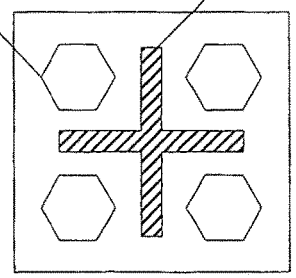

A nozzle block may include multiple nozzles and/or exhausts in a variety of configurations. The number and spacing of the nozzles and exhausts may depend on the materials to be deposited, a desired deposition pattern, or other criteria. FIGS. 5A-5F show schematic top views of exemplary configurations of nozzles and exhausts in a nozzle block. The nozzles 510 and vacuum sources 520 may be arranged in any pattern, though an array may be preferred. As used herein, nozzles are configured in an "array" if the nozzles are arranged in a repeating pattern such as a grid. For some applications, such as depositing an OLED, a rectangular array (i.e., the outer perimeter defined by the nozzles and/or exhausts is rectangular) may be preferred, though other configurations can be used. Exhausts may be disposed between each pair of adjacent nozzles, as shown in FIG. 5A, or an exhaust may be placed adjacent having multiple nozzles as shown in FIG. 5B. In some configuration, an exhaust 530 may be disposed in an outermost region of the nozzle block. FIG. 5C shows a linear, or "one-dimensional" nozzle array. FIGS. 5D-5F show additional exemplary configurations that may be used. As shown in FIG. 5F, an exhaust may have any desirable cross-section, so that a single exhaust may be adjacent to multiple nozzles. Configurations other than those illustrated may be used.

The exhaust may be in fluid communication with a vacuum source. If the apparatus is disposed within a vacuum chamber, the exhaust may be in communication with the ambient vacuum created by an evacuation source of the chamber. FIG. 6A is a schematic representation of an OVJD apparatus having an exhaust, where the exhaust is in fluid communication with the ambient vacuum of a vacuum chamber. A nozzle block 600 disposed within a vacuum chamber 620 may have an exhaust 610 between nozzles in the block. An evacuation source 630 is used to create a desired vacuum within the vacuum chamber 620. The exhaust 610 may be in fluid communication with the ambient vacuum created within the vacuum chamber 620, creating a localized vacuum in the region between the jets.

In a linear nozzle array, the area between the nozzles is in fluid communication with an ambient vacuum via the "front" and "back" of the array (i.e., out of and into the page in an array as illustrated in FIG. 4A). However, pressure buildup may still result in the region between adjacent nozzles and roughly in the plane defined by the linear array. For example, referring to FIG. 4B, a nozzle block 400 having two nozzles 410 is shown. Regions to the front and back of the block (440, 445), are in ambient vacuum. The region 450 between the nozzles 410 may therefore be described as "in fluid communication with" ambient vacuum. As previously noted, the flow paths between region 450 and regions 440, 445 are not exhausts as used herein. Pressure buildup may occur in the region 450 as material is ejected from the nozzles. It therefore may be desirable to provide an exhaust 420 above the region 450 to decrease this pressure buildup. It may be preferred for the exhaust 420 to be a vertical exhaust through the nozzle block 400. As used herein, an exhaust is described as "in fluid communication with ambient vacuum" when it provides a flow path between a region of space and an ambient vacuum that would not exist in the absence of the exhaust. Thus, the exhaust in FIGS. 4A and 4B is not in fluid communication with the ambient vacuum to the front and back of the nozzle block 400, but is in fluid communication with the ambient vacuum above the nozzle block.

In general, an exhaust does not include a flow path parallel to the substrate and extending from the region under the nozzle(s) to the edge of the substrate as is present in most non-exhaust configurations. For example, the systems simulated in FIGS. 10A-10D and 14A-14E include a flow path from the tip of each nozzle to each edge of the substrate, but these flow paths are not considered exhausts. In contrast, the systems simulated in FIGS. 16A-16E and 24A-24D have non-exhaust flow paths similar to those in FIGS. 10A-D and 14A-E, but have additional exhausts in the form of flow paths through the nozzle blocks. It may be preferred for an exhaust to be a vertical or partially vertical passage through a nozzle block. An exhaust may also be, for example, a channel passing through a nozzle block, a tube disposed within a nozzle block, or any other structure.

Pressure buildups may be more pronounced at smaller nozzle-substrate separations, which may be desired for depositing high-resolution films as described below. It is believed that providing an exhaust between adjacent nozzles in this region can decrease this pressure buildup. It may be preferred for the exhaust to be roughly perpendicular to the substrate (i.e., parallel to the nozzles) in this region. The exhaust may comprise a channel, such as through a nozzle block, that connects to ambient vacuum at the channel end away from the nozzles. The channel may connect to ambient vacuum at the top of the nozzle block, as illustrated in FIG. 4A, or it may connect to ambient vacuum on one or more sides of the nozzle block. It is believed that exhausts such as those illustrated in FIGS. 3-5 may decrease the pressure effects caused when a nozzle block is in close proximity to a substrate.

Figure 6C:
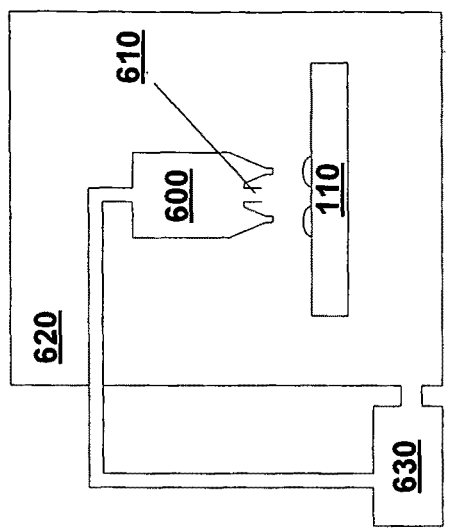
FIG. 6C is a schematic side view of an OVJD apparatus having an exhaust directly connected to an evacuation source of a vacuum chamber.
Figure 6B:
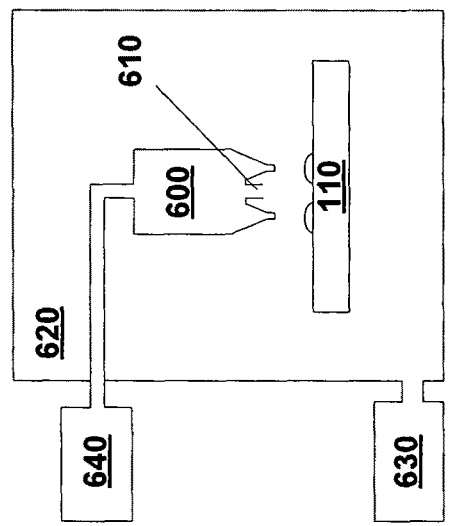
FIG. 6B is a schematic side view of an OVJD apparatus having an exhaust directly connected to an independent vacuum source.
Figure 6A:
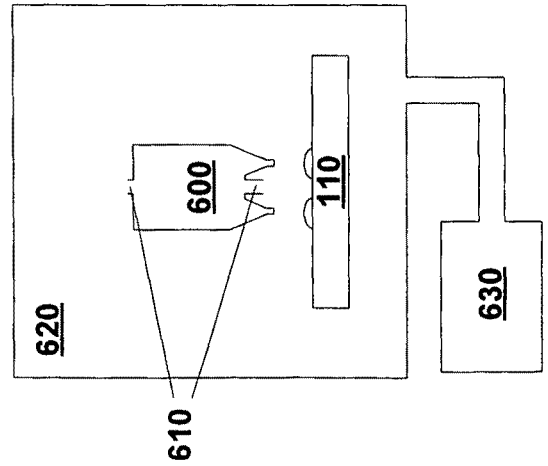
FIG. 6A is a schematic side view of an OVJD apparatus having an exhaust in fluid communication with the ambient vacuum of a vacuum chamber.

The exhaust may also be directly connected to a vacuum source, such as by a pipe, tube, or other similar structure, as shown in FIGS. 6B and 6C. In FIG. 6B, the exhaust 610 is in fluid communication with and directly connected to an independent (i.e., separate from the evacuation source 630) vacuum source 640. A direct connection may be made, for example, via a pipe, tube, or other structure that separates the connection between the vacuum source and the exhaust from the ambient vacuum. Similarly, in FIG. 6C the exhaust is directly connected to the evacuation source 630. It will be understood that the specific configurations shown in FIGS. 6A-6C are exemplary, and other arrangements of vacuum source and exhaust may be used. Although only a single exhaust is illustrated, similar structures may be used for other exhaust configurations, such as those shown in FIGS. 5A-5F. For example, if the exhaust comprises multiple pathways through a nozzle block, each pathway may be connected to a vacuum source.

Configurations such as those shown in FIGS. 6B and 6C may be used to prevent currents formed in the vacuum chamber 620 from affecting a localized vacuum formed between nozzles. As the evacuation source 630 removes material from the vacuum chamber 620 while material is ejected from the nozzle block 600, various pressure gradients may be formed within the vacuum chamber, and specifically in the region between the nozzle block 600 and the substrate 110. If the exhaust 610 is directly connected to a vacuum source instead of the ambient vacuum, a localized vacuum may be formed between nozzles. A localized vacuum formed by such a configuration may be less likely to be altered by the movement of other material or changes in the ambient vacuum, and therefore may provide more consistent or controllable results. The use of an exhaust may also allow for improved nozzle-to-nozzle uniformity, which can allow for uniformly predictable deposition independent of the number or configuration of nozzles used to deposit layers on the substrate.

The resolution of a film produced by an OVJD system may also be influenced by the size of the nozzle openings, the nozzle spacing and the nozzle-substrate separation. As used herein "resolution" refers to the size, spacing, and sharpness of areas in which material is deposited. In general, a higher resolution—i.e., smaller, more sharply defined deposition areas—is desirable. For example, when used to fabricate an OLED, it may be useful to use an array of nozzles, where each nozzle is used to deposit a single pixel. To achieve a higher-resolution display, it may be desirable for the pixels to be small and sharply-defined, with minimal separation between adjacent pixels.

To achieve a high resolution, it may be preferred to use a nozzle-substrate separation of about 2 microns to about 20 microns, more preferably about 2 microns to about 10 microns. Smaller nozzle-substrate separations may be desirable to reduce diffusive spreading of the ejected material. The nozzle-substrate separation refers to the distance from the upper surface of the substrate to the nozzle opening from which material is ejected. A nozzle opening having a diameter of about 2 microns to about 50 microns, and more preferably about 2 microns to about 10 microns in diameter may be used. The nozzle-substrate separation and the nozzle diameter may be related. For example, a larger nozzle opening may require a greater nozzle-substrate separation to prevent nozzle clogging, substrate damage, or undesirable pressure buildup. Thus it may be desirable to select a nozzle diameter d for a nozzle substrate s where the ratio d/s is about 1.0 to about 2.5.

The resolution of a deposited film may also be affected by the flow rate of material ejected from the nozzle. In general, when a jet is not used, a lower flow rate may be more desirable. A flow rate corresponding to a velocity of about 1.0 m/s to about 100 m/s may be preferred, or more preferably about 0.01 m/s to about 10 m/s. Lower flow rates may be preferred to prevent buildup of pressure near the nozzle opening. Preferred velocities may also be related to and/or determined from the temperature of the ejected material as it is ejected from the nozzle. Generally, a higher velocity may be preferred for higher-temperature material. The desired velocity may be scaled relative to about room temperature; thus, a flow rate corresponding to a velocity of $(1.0 \text{ m/s}) \times T/300$ to $(100 \text{ m/s}) \times T/300$, or more preferably $(0.01 \text{ m/s}) \times T/300$ to $(10 \text{ m/s}) \times T/300$, may be used, where T is the temperature of the ejected material in kelvins.

The carrier gas velocity may be increased so that the bulk flow velocity is at least on the order of the thermal velocity of the molecules, creating a "jet" of material that is essentially unidirectional. In mathematical terms, this condition may be met when the mean velocity in the direction of the axis of the nozzle (the bulk flow velocity) is at least on the order of the mean absolute velocity in directions perpendicular to the axis of the nozzle (the thermal velocity). Preferably, the mean velocity in the direction of the axis of the nozzle is at least as great as the mean absolute velocity in directions perpendicular to the axis of the nozzle. The term "absolute" velocity is used with respect to mean velocity in directions perpendicular to the axis of the nozzle, because the mean velocity in those directions may be about zero—for every molecule moving to the left at a particular velocity, there may be another molecule moving to the right at the same velocity. Under the appropriate conditions of substrate temperature, reactor pressure, and nozzle geometry, an array of sharp-edged pixels with a resolution of about 1 micron is achievable with jet deposition if the nozzle-substrate separation, is within the molecular mean free path of the carrier gas. In addition, because of the unidirectional flow, use of a heavier carrier gas can provide better directionality of deposition and subsequently sharper pixels. When a jet configuration is used, it may be preferred for the ejected material to have a flow rate equivalent to a velocity of about 100 m/s to about 400 m/s. These velocities also may be scaled based on the temperature of the ejected material as previously described.

The nozzle spacing, i.e., the distance from roughly the center of the opening of one nozzle to roughly the center of the opening of another nozzle, may also affect the resolution of a deposited layer. To achieve a high resolution, a nozzle spacing of about 50 microns to about 100 microns may be preferred. In general, a greater nozzle spacing may prevent mixing of material ejected from adjacent nozzles.

To model behavior of material ejected from one or more nozzles as it travels toward the substrate in OVJD, the following equations may be used:

$$\nabla \cdot (-D_i \nabla C_i + C_i \vec{U}) = 0$$

$$\nabla \cdot (-k\nabla T + \rho C \rho T \vec{U}) = Q$$

$$-\nabla \cdot \mu(\nabla \vec{U} + (\nabla \vec{U})^T) + \rho(\vec{U} \cdot \nabla)U + \nabla P = F$$

$$\nabla \vec{U} = 0$$

These equations describe the velocity field $\vec{U}$, pressure P, temperature T, concentration C, viscosity μ, thermal conductivity k, density ρ, and diffusivity D in the nozzle and the region between the nozzle and substrate. They may be used to create specific models as described below to predict values that can be used to achieve a desired resolution.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:
CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
Ir(ppy)$_3$: tris(2-phenylpyridine)-iridium
Ir(ppz)$_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)

EXPERIMENTAL

Specific representative embodiments of the invention will now be described, including how such embodiments may be made. It is understood that the specific methods, materials, conditions, process parameters, apparatus and the like do not necessarily limit the scope of the invention.

Figure 7:
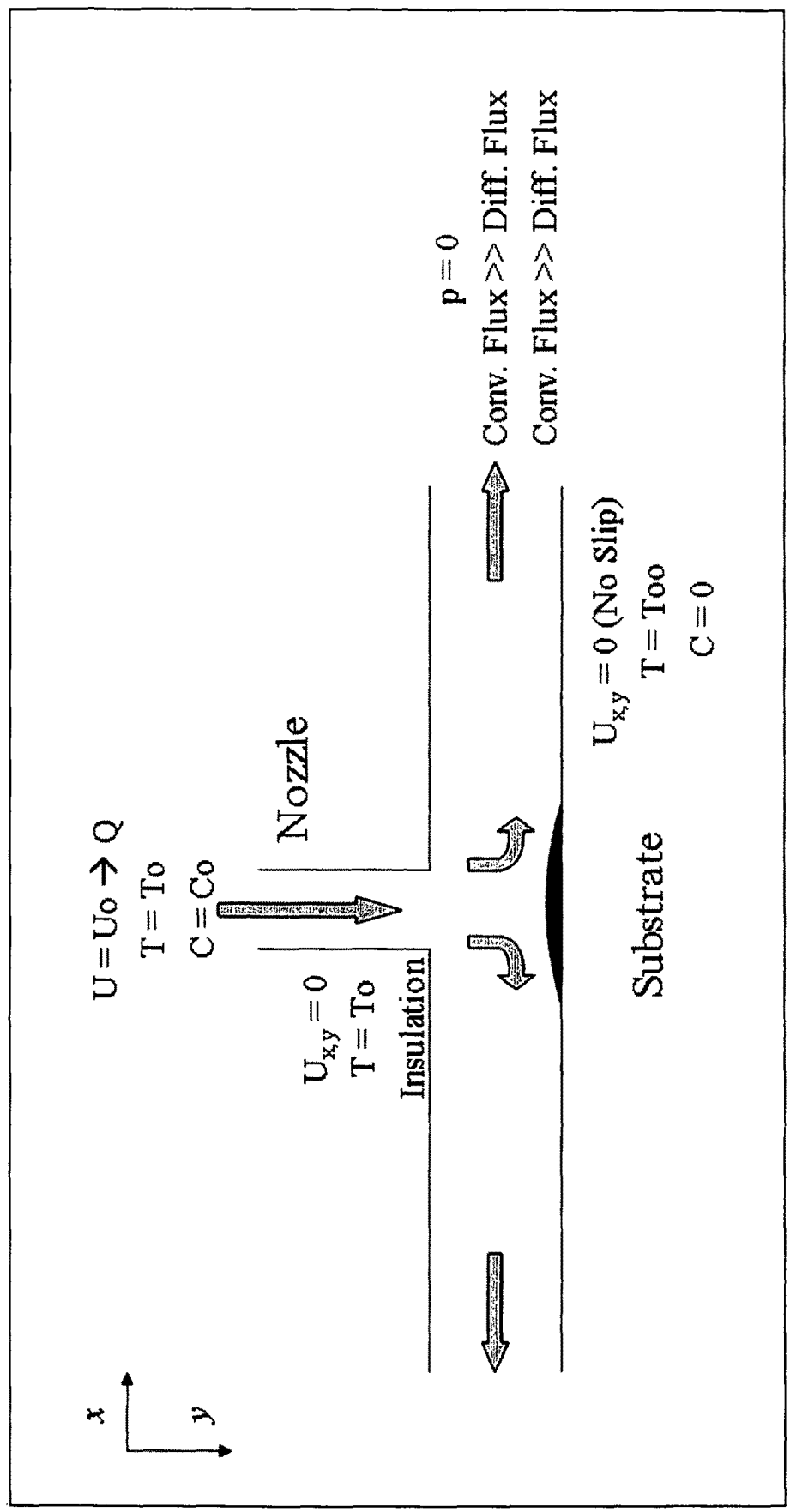
FIG. 7 shows boundary conditions for simulations of OVJD systems.
Figure 8:
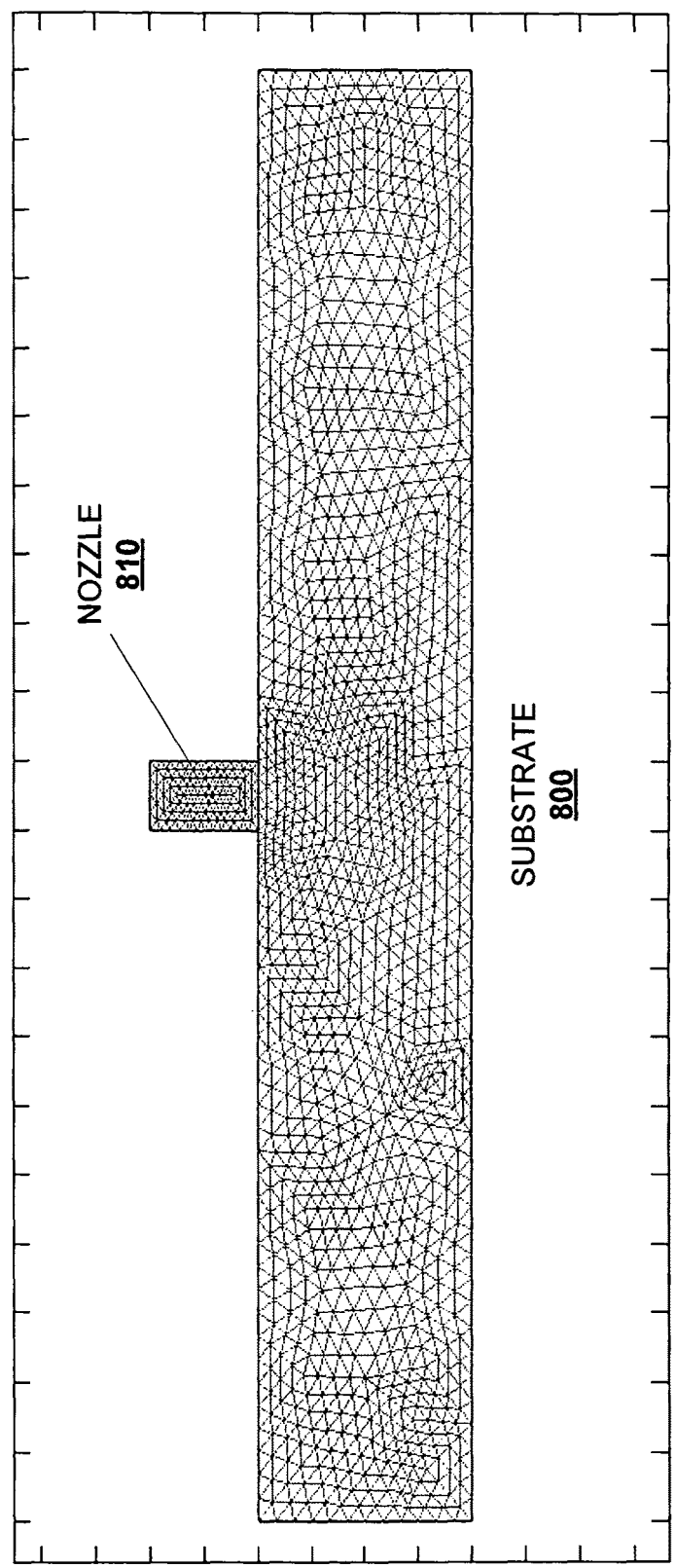
FIG. 8 shows an exemplary mesh used to model various OVJD systems.
Figure 9:
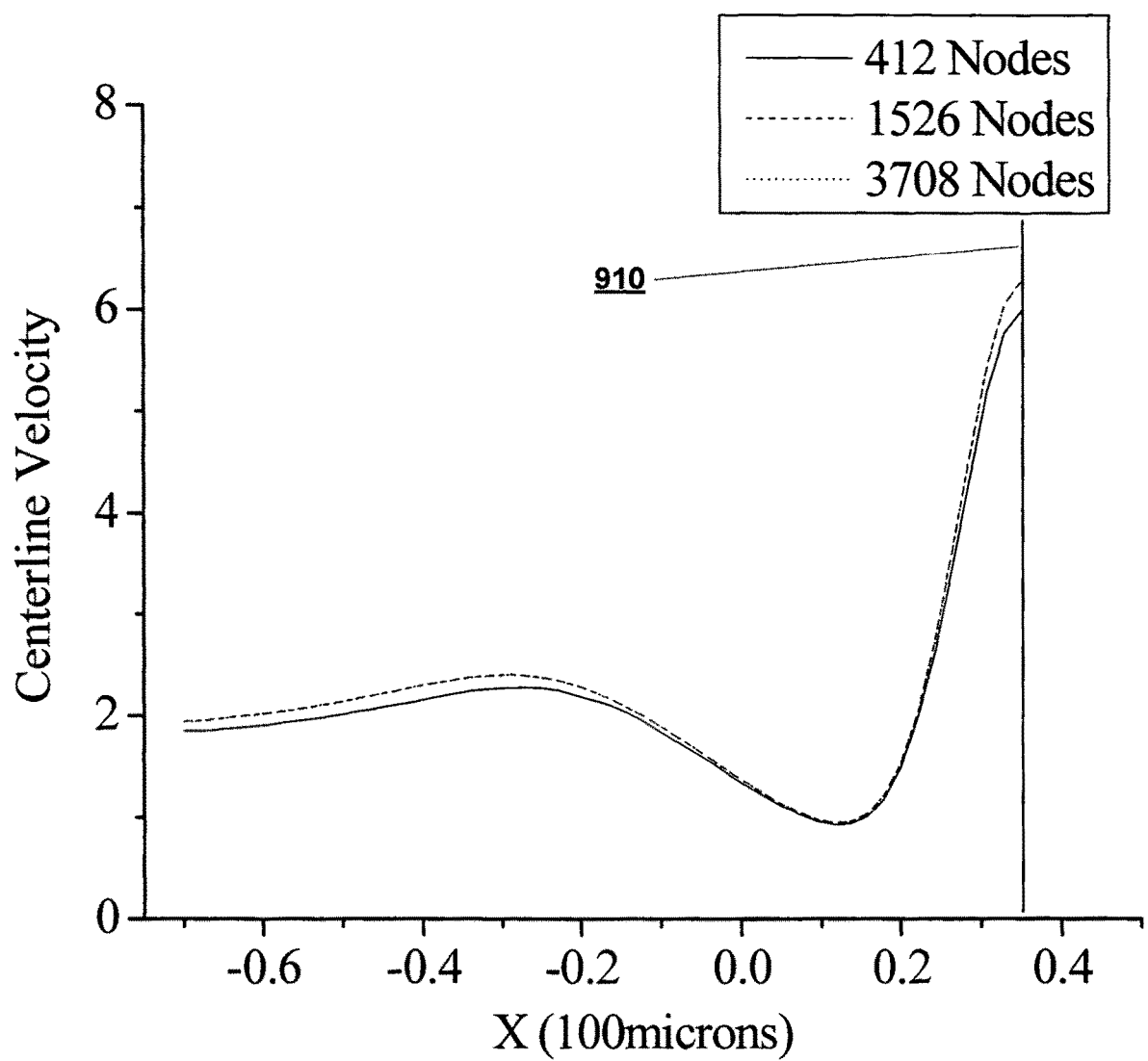
FIG. 9 shows exemplary simulation results for a variety of mesh nodes.
Figure 10B:
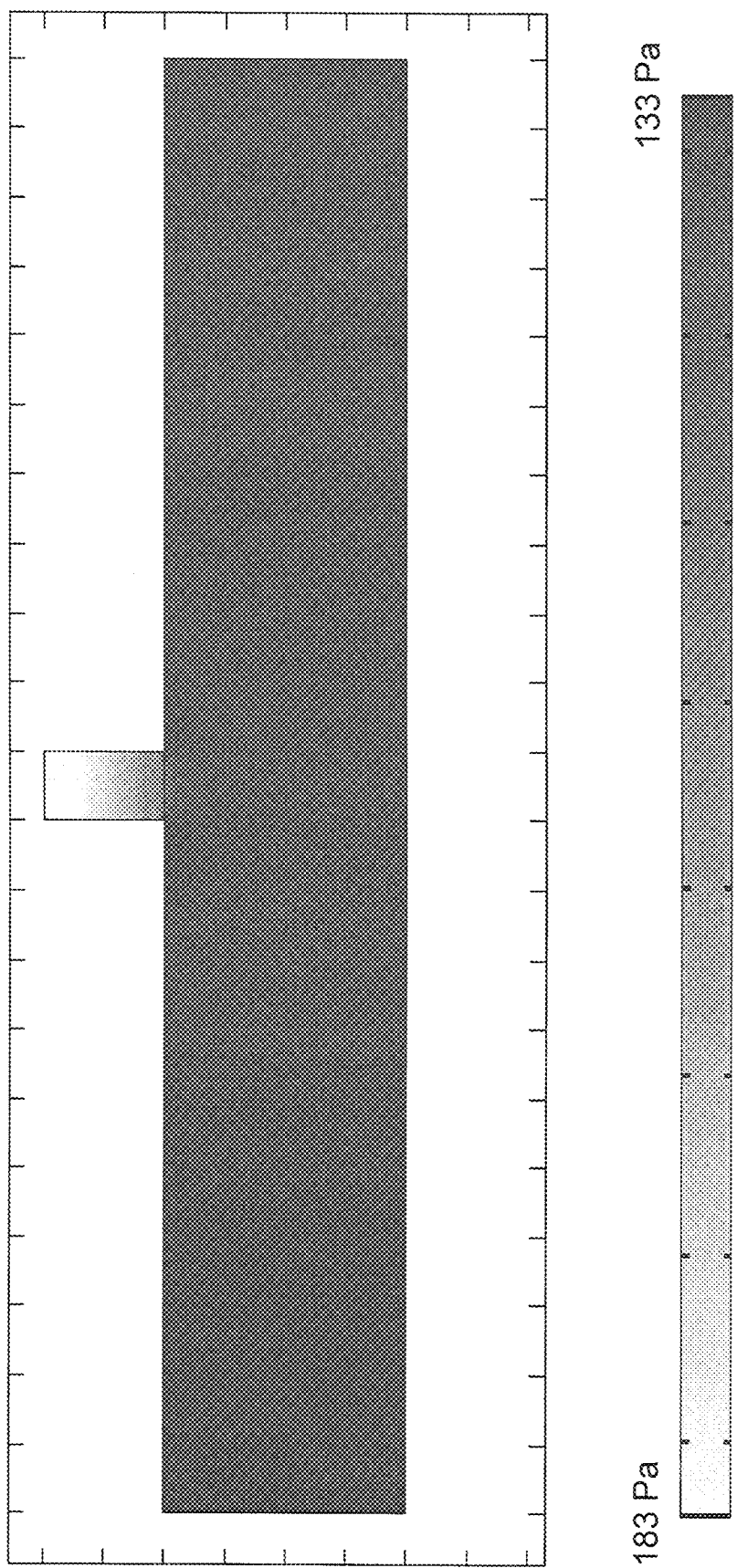
Figure 10C:
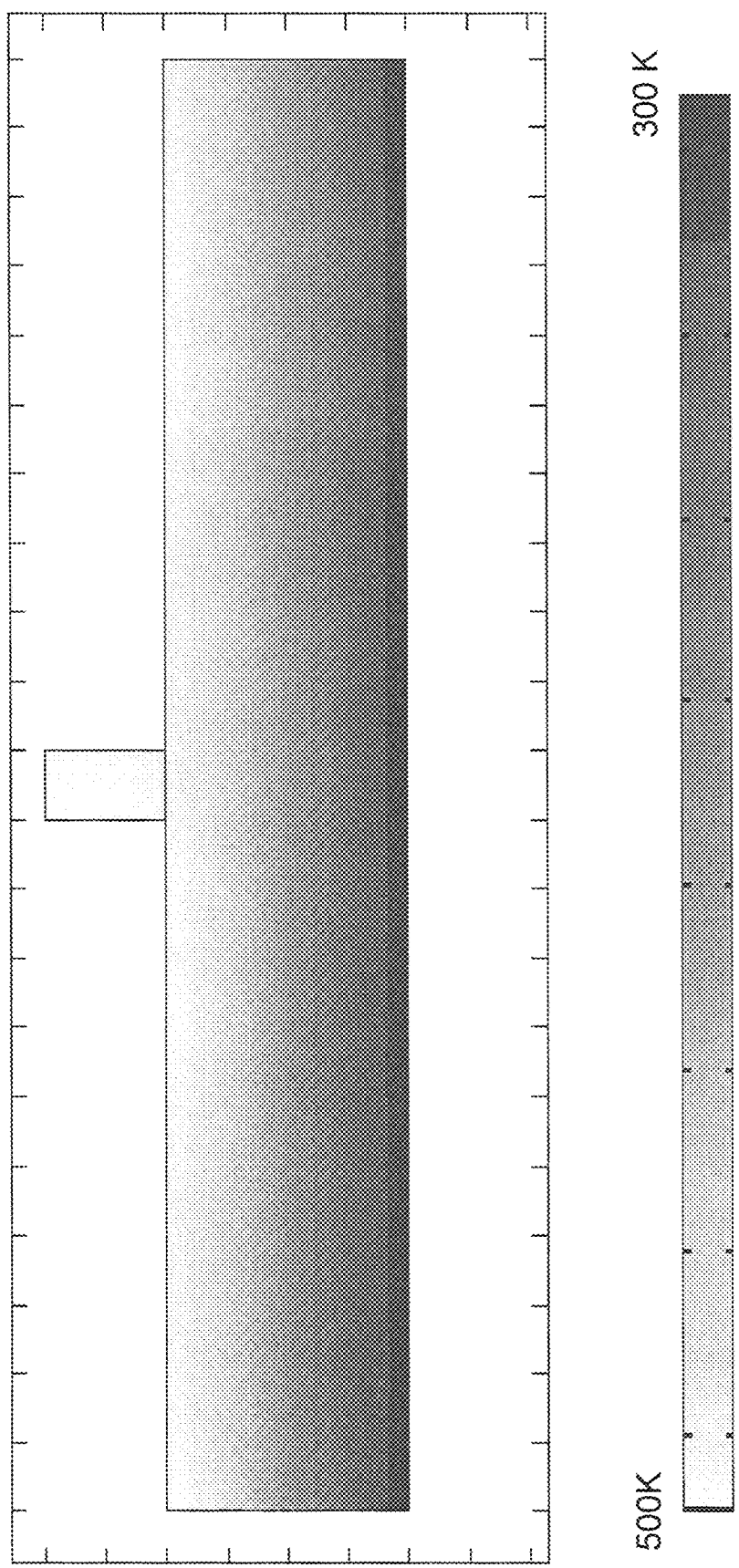
Figure 10D:
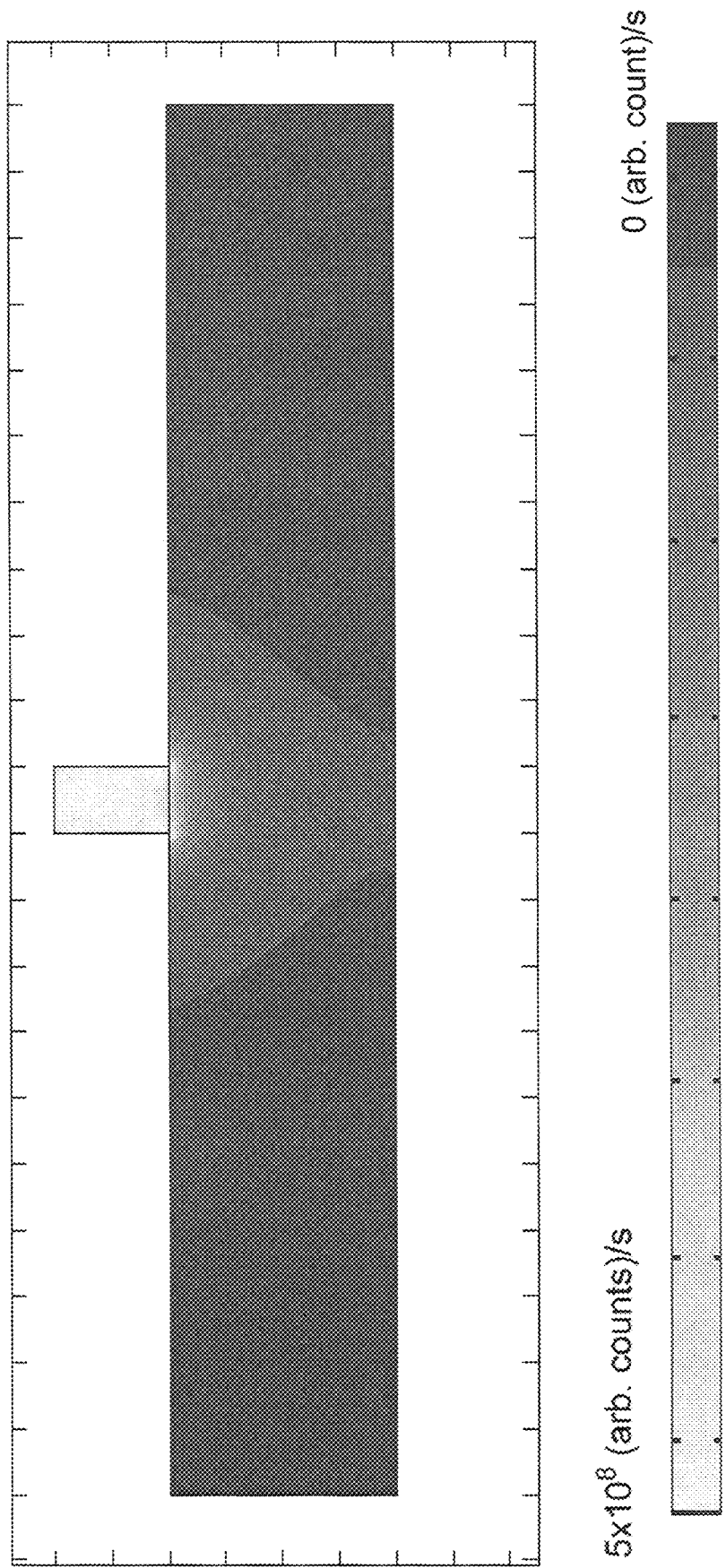

Using the equations described above, simulations were created and solved using the boundary conditions shown in FIG. 7. It was assumed that the temperature of the substrate is low enough that the concentration of organic material in the gas phase directly above the substrate can be approximated as 0. That is, it was assumed that there was no re-evaporation of deposited material. FIG. 8 shows the mesh used in creating the simulations; the mesh was defined within the nozzle 810 and between the nozzle 810 and substrate 800. Models were constructed and solved numerically using Femlab. The example mesh shown in FIG. 8 further assumes a nozzle opening of 10 μm and a substrate width of 210 μm. Sample data was created to determine an appropriate number of nodes to use in simulations, as shown in FIG. 9. The axis of symmetry 910 is shown for reference. There was little variation in results for more than about 1500 nodes; subsequent models therefore used approximately 1500 nodes.

FIGS. 10A-10D show, respectively, the velocity, pressure, temperature, and total flux (including diffusive and convective) for a simulation of a single nozzle. The simulation used a background pressure of 133 Pa and a nitrogen carrier gas with an inlet flow rate of $6.5 \times 10^{-6}$ sccm (corresponding to a velocity of about 1.0 m/s). As can be seen from FIG. 10D, the flux at the surface of the substrate is directly proportional to the separation. Flux at the surface of the substrate may be used to determine the deposition shape, since the accumulation (thickness) of material at the surface is given by flux scaled by time.

Figure 11B:
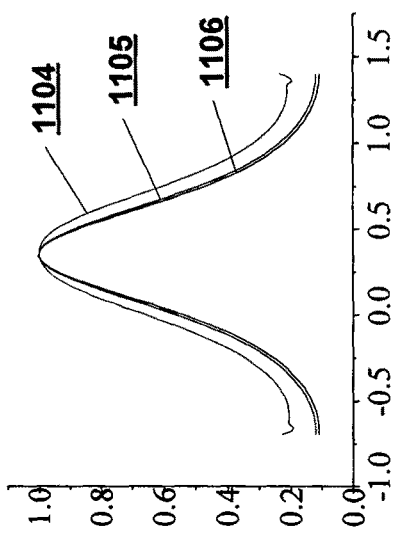
FIGS. 11A-11B show the raw and normalized deposition profiles, respectively, for a simulation of a nitrogen carrier gas ejected from a nozzle in an OVJD system.
Figure 11A:
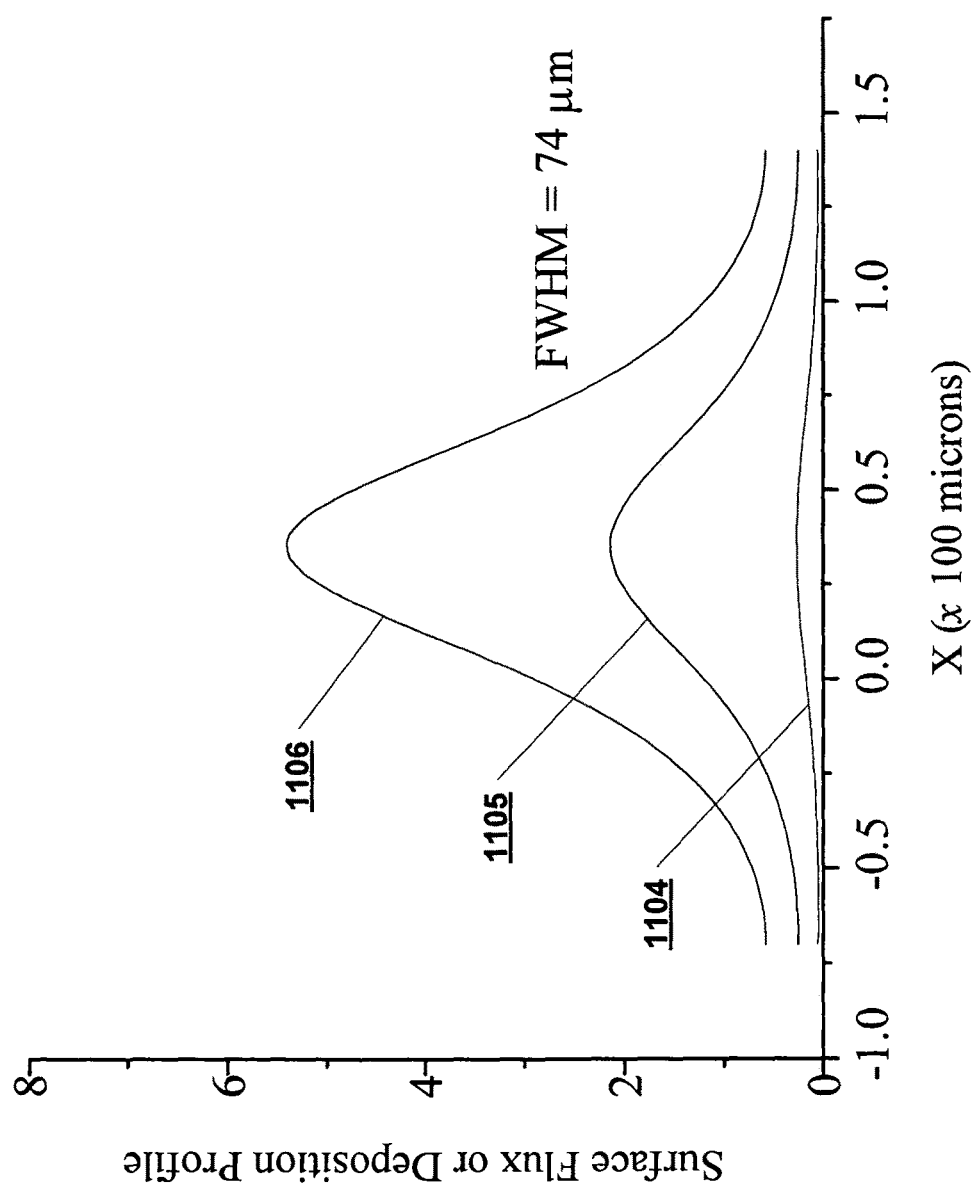

FIGS. 11A-11B show the deposition profiles (i.e., surface flux) for a nitrogen carrier gas ejected from a 10 micron nozzle at flow rates of $6.5 \times 10^{-4}$ sccm (1104), $6.5 \times 10^{-5}$ sccm (1105), and $6.5 \times 10^{-6}$ sccm (1106), at a background pressure of 1 torr. These flow rates correspond to velocities of about 100 m/s, 10 m/s, and 1.0 m/s, respectively. As seen from the figures, higher flow rates may reduce the surface flux due to a greater pressure differential. There may also be a foreline buildup of pressure at higher flow rates. This indicates that lower flow rates may generally provide a higher resolution.

Figure 12:
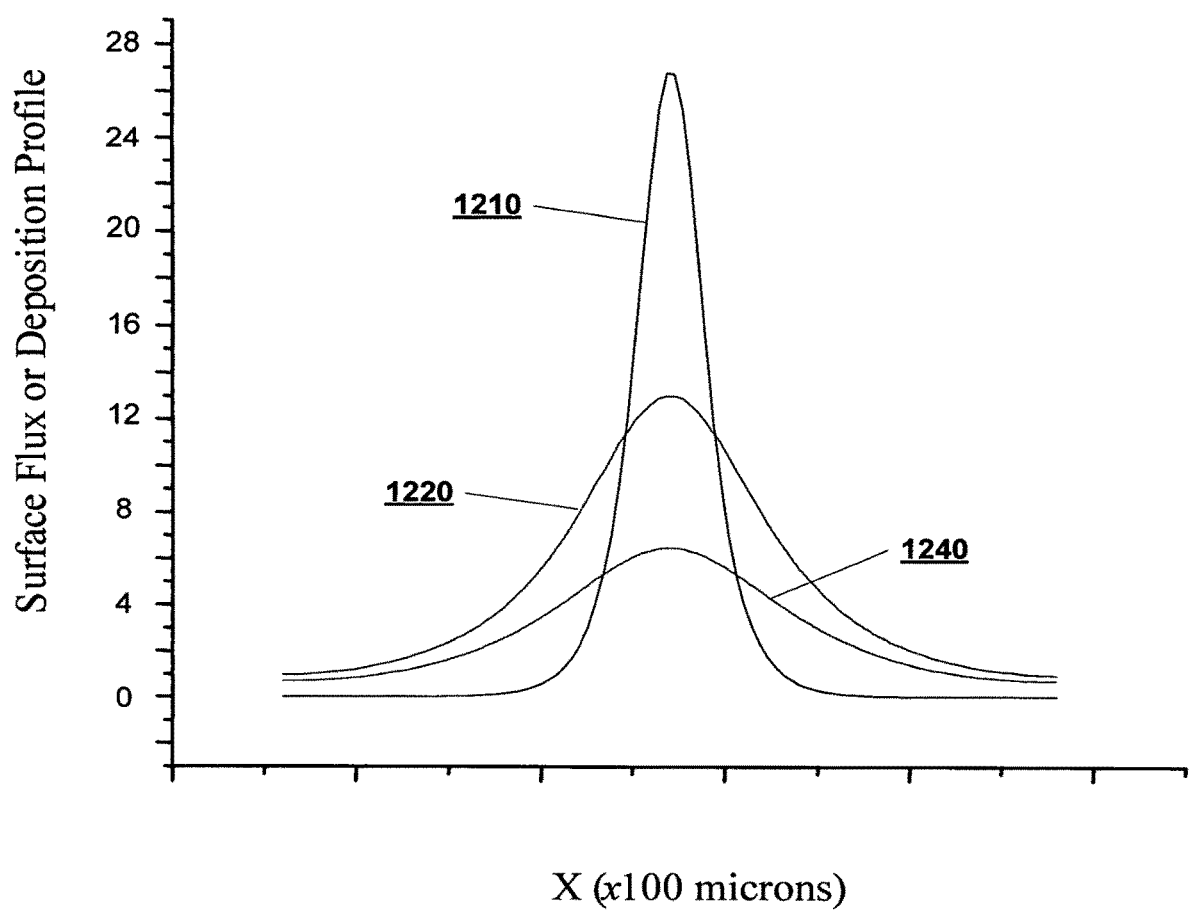
FIG. 12 shows the simulated deposition profile for various nozzle-substrate separations.
Figure 13:
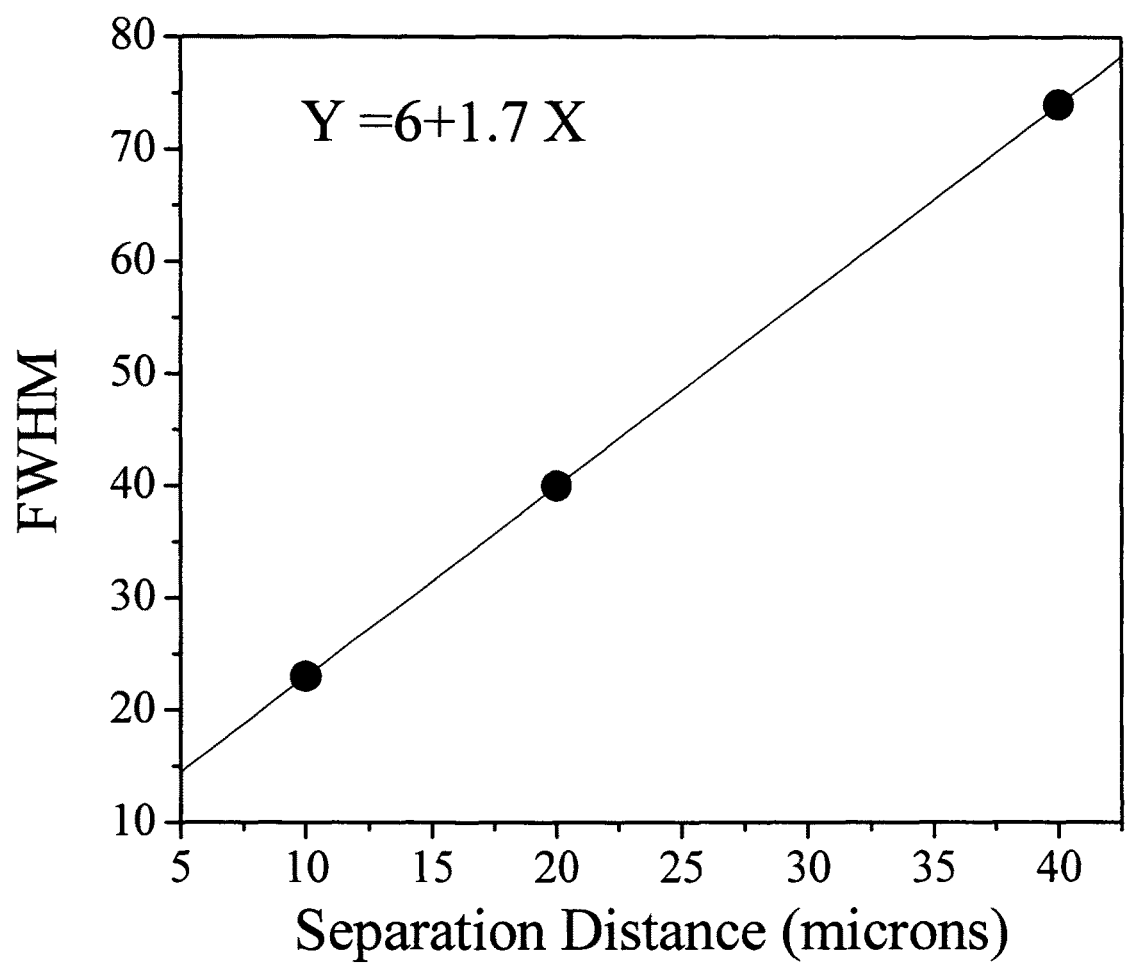
FIG. 13 shows the resulting (FWHM) for the separations used for FIG. 12.

FIG. 12 shows the deposition profile for nozzle-substrate separations of 10 microns (1210), 20 microns (1220), and 40 microns (1240); FIG. 13 shows the resulting full width at half maximum (FWHM) for the same separations. The resolution may be improved with smaller nozzle-substrate separations since the space and time for diffusive spreading is decreased. These results are consistent with those in Shtein et al., "Direct mask-free patterning of molecular semiconductors using organic vapor jet printing," J. Appl. Phys., v. 96, No. 8, Oct. 15, 2004. The resulting FWHM may be used to determine nozzle spacing in a multi-nozzle system.

Figure 14E:
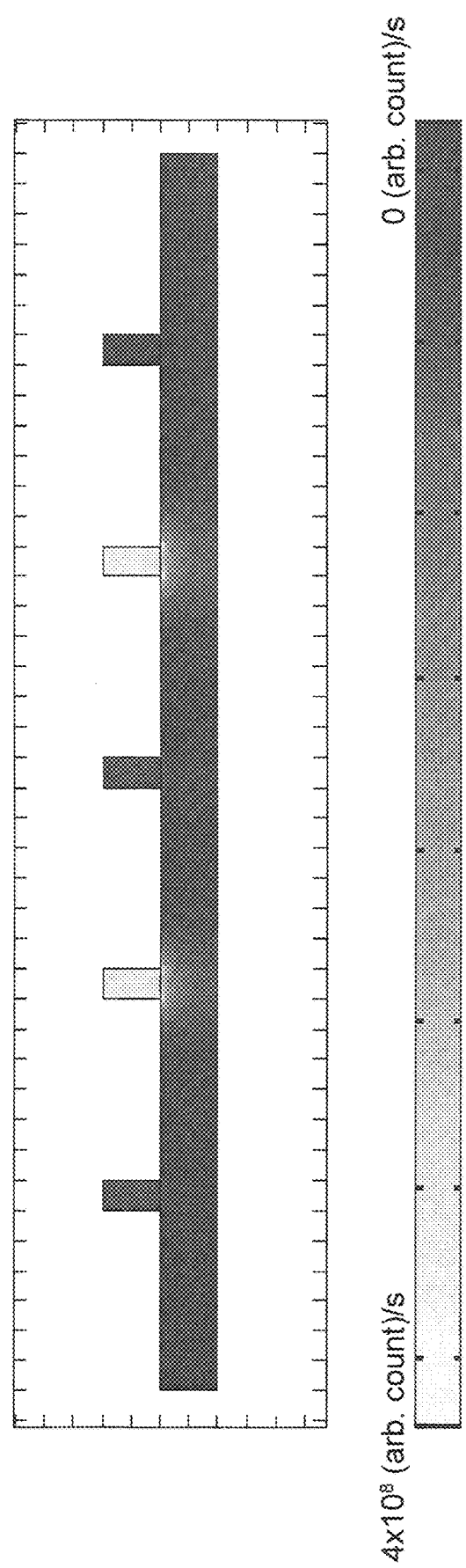
FIG. 14E shows the total flux for Material 2 in the same simulation illustrated in FIGS. 14A-14C.

FIGS. 14A-14C show the velocity, pressure, and temperature for a simulation of a multiple-nozzle system ejecting different materials, without an exhaust disposed between adjacent nozzles. FIG. 14D shows the total flux for Material 1; FIG. 14E shows the total flux for Material 2. The diffusivity of each material was about equal at a given temperature and pressure (i.e., although the pressure and temperature vary throughout the simulation space, the diffusivities vary accordingly). The simulation used a background pressure of 133 Pa and a nitrogen carrier gas with an inlet flow rate of $6.5 \times 10^{-6}$ sccm (corresponding to a velocity of about 1.0 m/s) at each nozzle. As seen by comparing FIG. 14B to FIG. 10B, a much higher buildup of pressure occurs in the multi-nozzle configuration.

Figure 15:
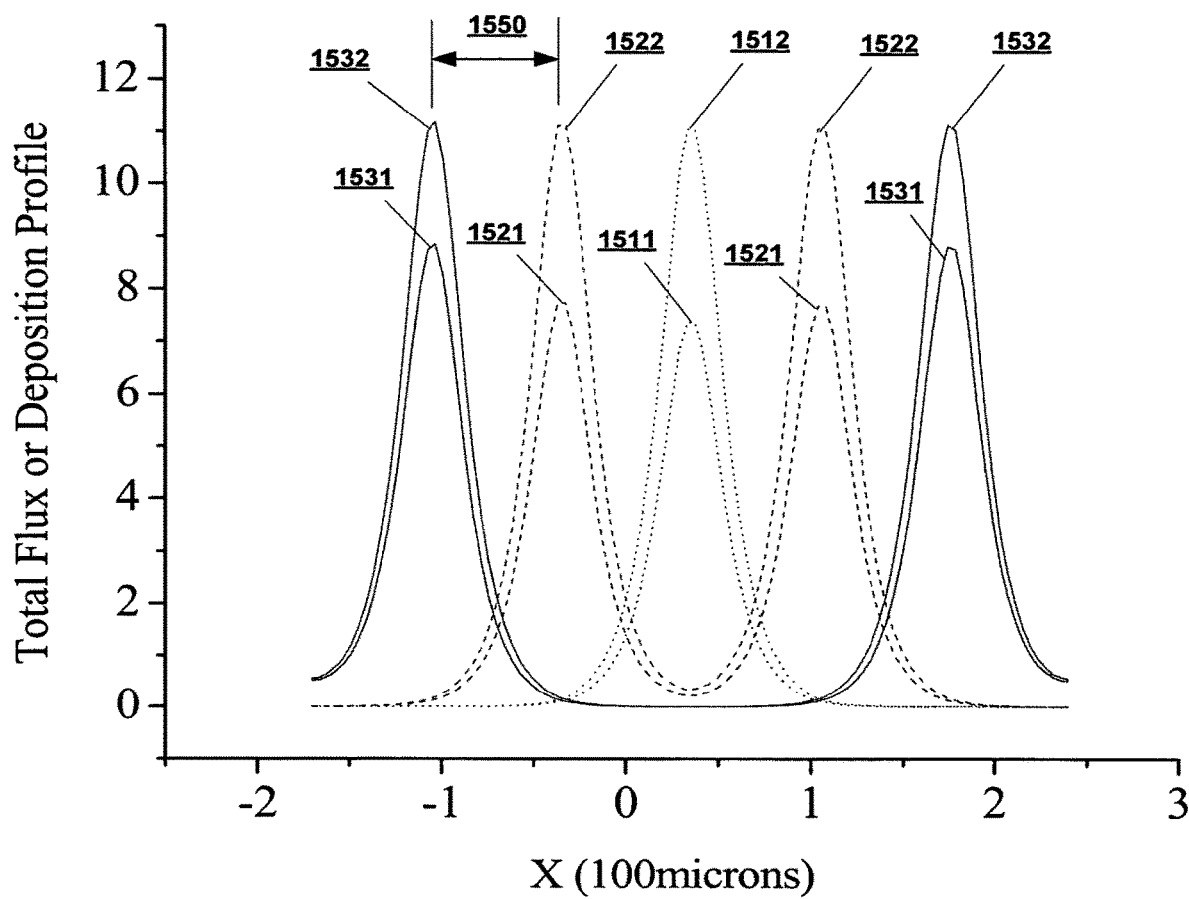
FIG. 15 shows a simulated deposition profile for a multi-nozzle system having an exhaust.

FIG. 15 shows a deposition profile for a multi-nozzle system having an exhaust between each adjacent pair of nozzles. The profile for three materials (1512, 1522, 1532) deposited from five nozzles is shown; a profile for the same configuration but without an exhaust is shown for reference (1511, 1521, 1531). The nozzle spacing of 60 microns (1550) was determined from the FWHM. FIG. 15 shows that an exhaust between adjacent nozzles reduces pressure variation, and therefore the diffusivity/flux variation.

Figure 16C:
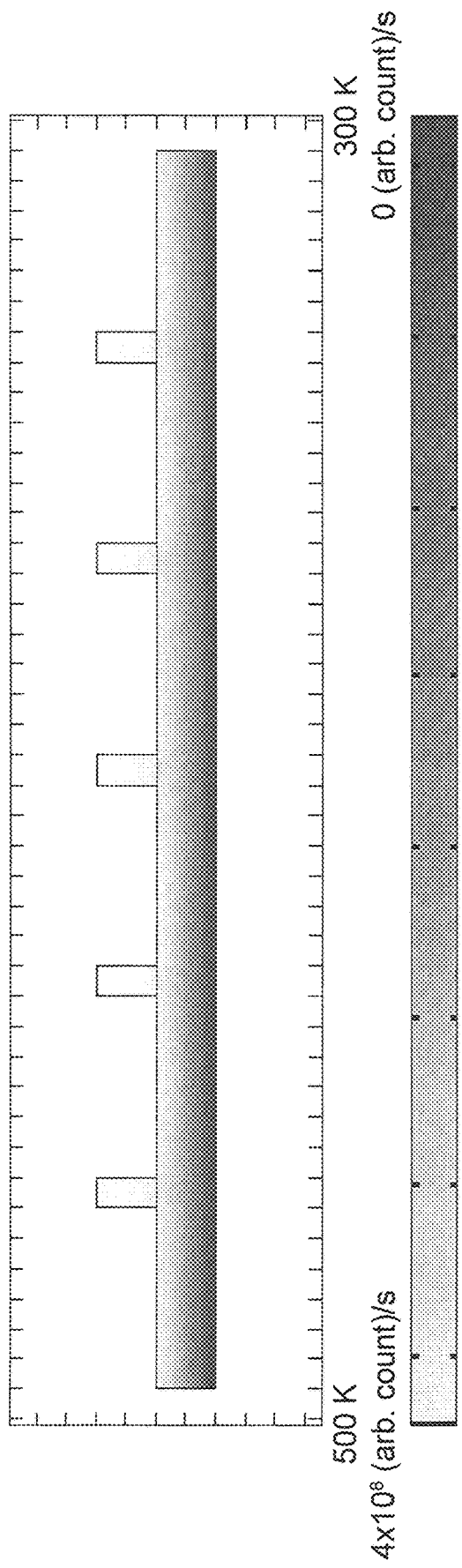
Figure 16D:
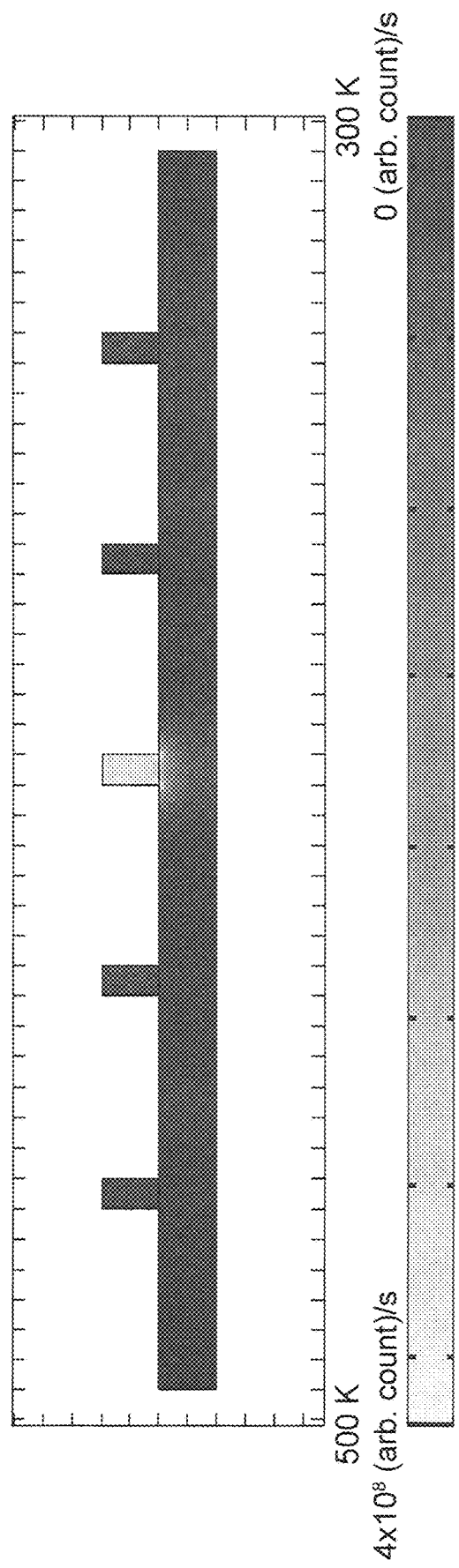
FIG. 16D shows the total flux for Material 1 in the same simulation illustrated in FIGS. 16A-16C.
Figure 16E:
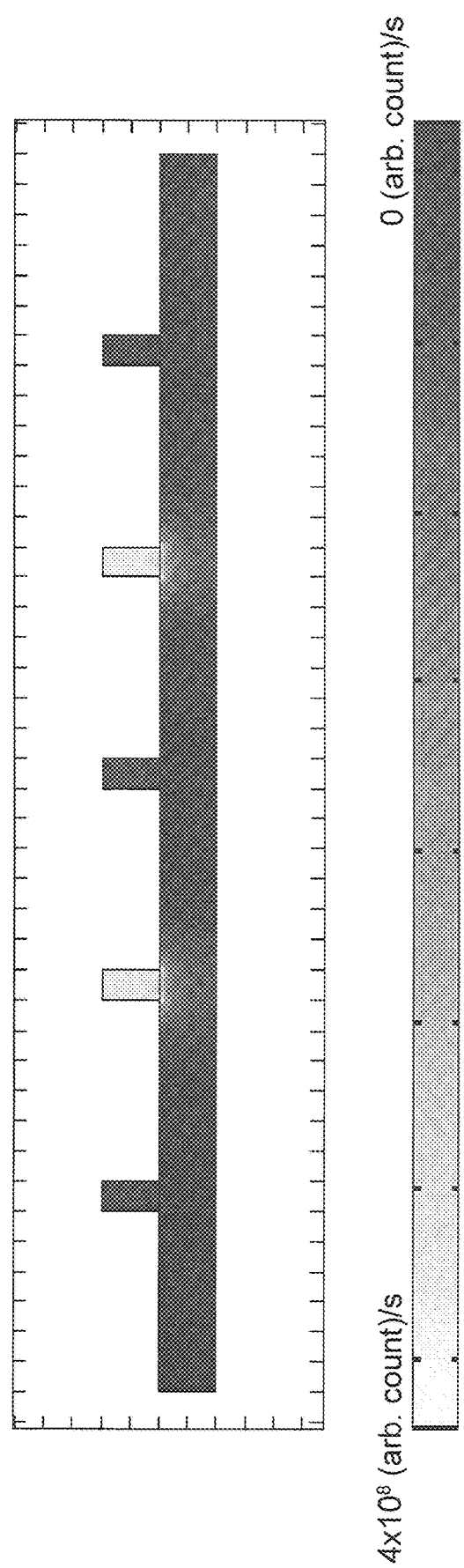
FIG. 16E shows the total flux for Material 2 in the same simulation illustrated in FIGS. 16A-16C.

FIGS. 16A-16C show the velocity, pressure, and temperature for a simulation of a multiple-nozzle system ejecting different materials, where an exhaust is disposed between each pair of adjacent nozzles. FIG. 16D shows the total flux for Material 1; FIG. 16E shows the total flux for Material 2. The diffusivity of each material was about equal at a given temperature and pressure. The simulation used a background pressure of 133 Pa and a nitrogen carrier gas with an inlet flow rate of $6.5 \times 10^{-6}$ sccm (corresponding to a velocity of about 1.0 m/s) at each nozzle. As seen by comparison to FIGS. 14A-14E, and specifically comparison of FIGS. 16B and 14B, the buildup of pressure is greatly reduced in the configuration having an exhaust. This difference in pressure buildup is believed to explain the difference in deposition profiles illustrated in FIG. 15.

Figure 17A:
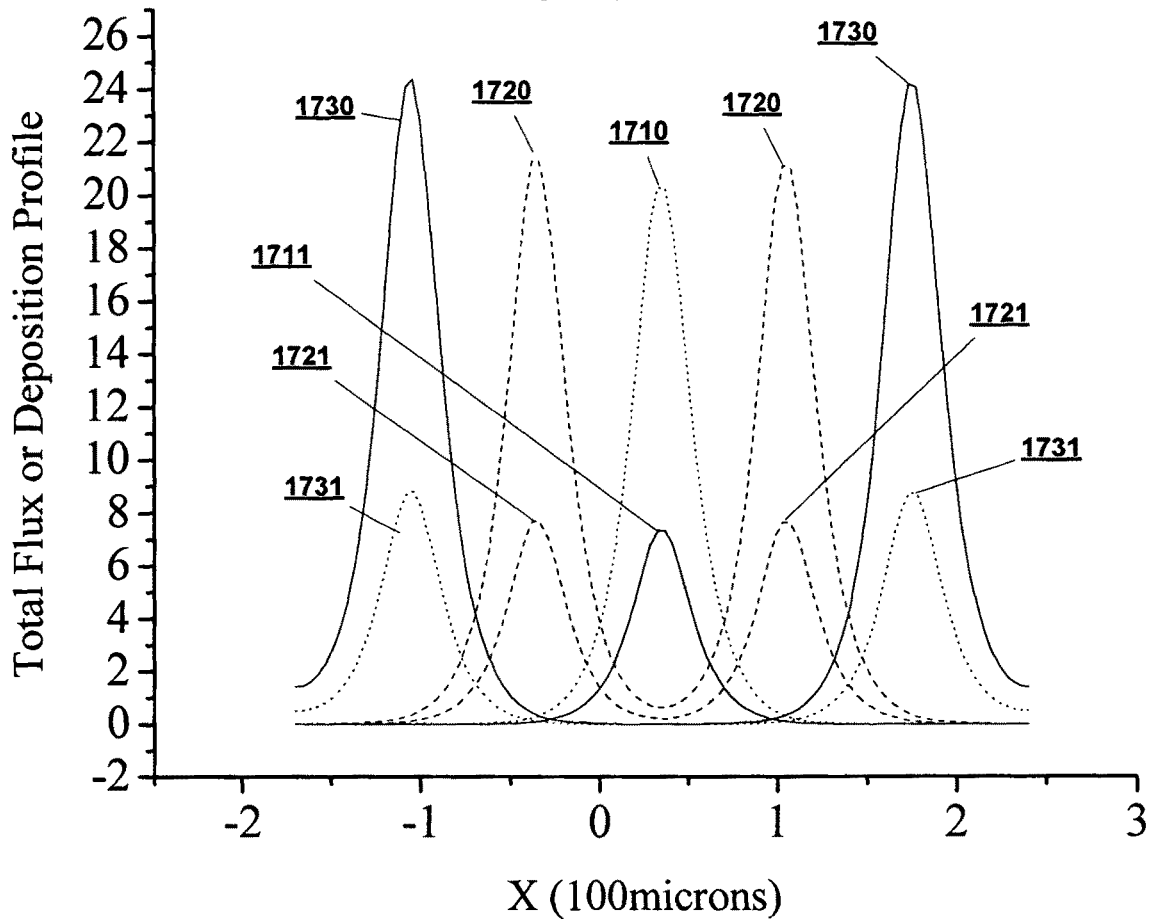
FIGS. 17A-17B show raw and normalized data, respectively, for simulated deposition profiles of materials ejected from a mutli-nozzle nozzle block using various carrier gases.
Figure 17B:
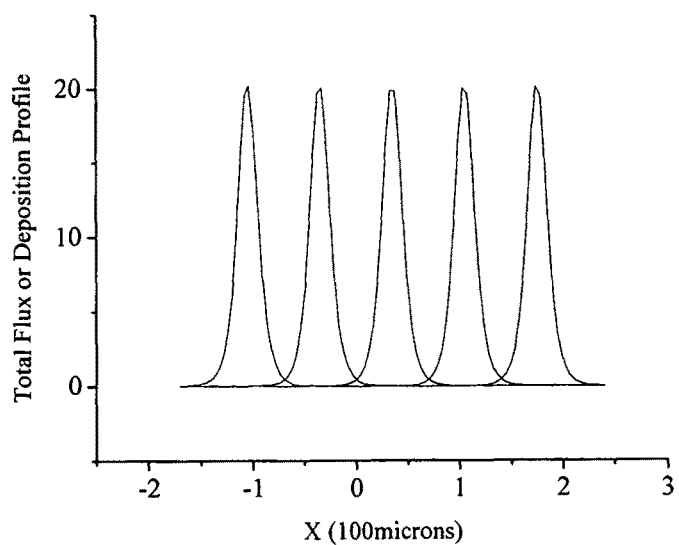

FIGS. 17A-17B show deposition profiles for materials ejected from a multi-nozzle nozzle block using nitrogen and helium as carrier gases. The plots 1710, 1720 and 1730 show Material 1, 2 and 3, respectively, using helium as a carrier gas. The plots 1711, 1721 and 1731 show Material 1, 2 and 3, respectively, using nitrogen as a carrier gas. The normalized data is shown in FIG. 17B. These results indicate that the carrier gas molecular weight and background pressure have little effect on the deposition profile. As both the molecular weight and background pressure are decreased, the magnitude of flux increases. This is likely due to less material being removed due to convection.

Figure 18:
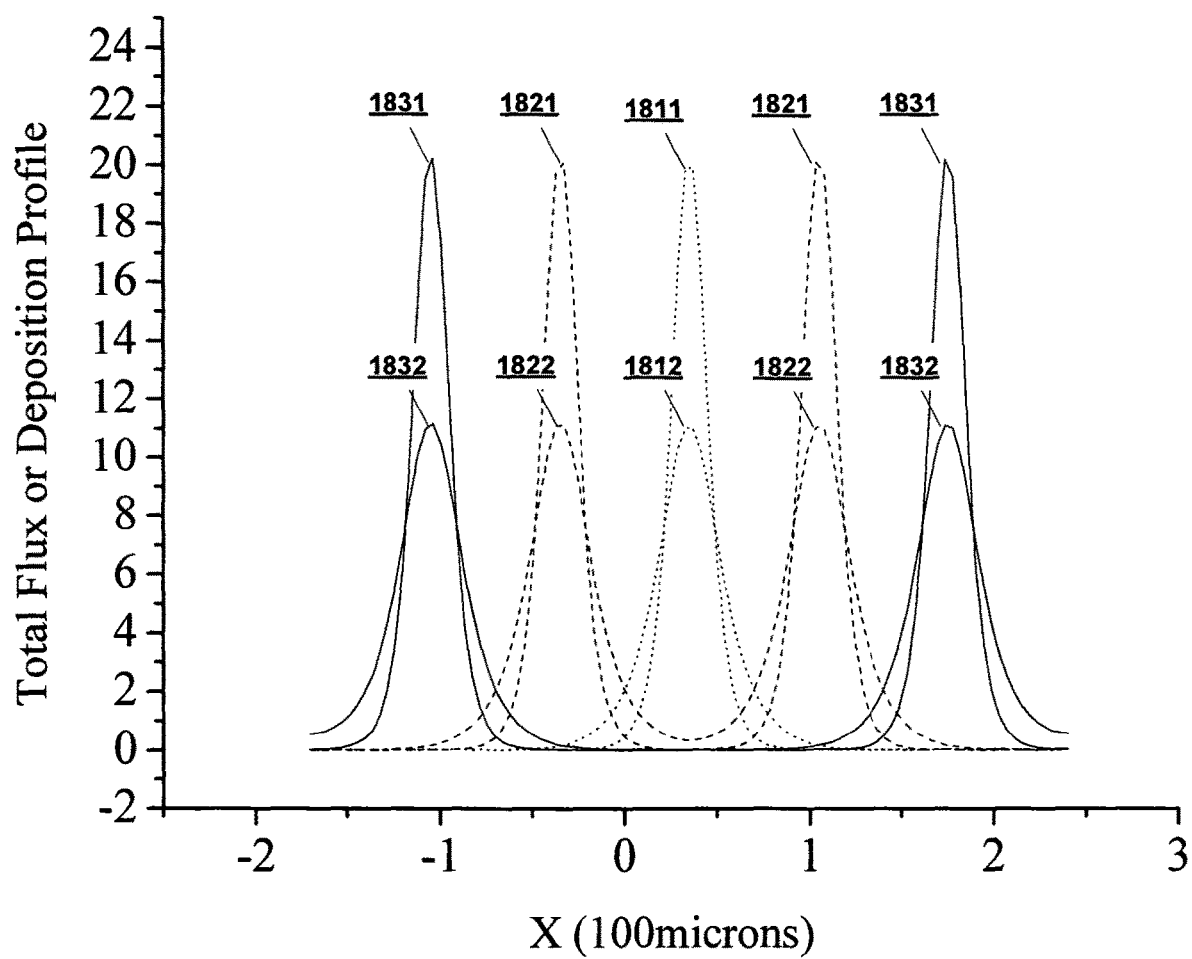
FIG. 18 shows the simulated deposition profile for five nozzles depositing three materials at various nozzle-substrate separations in a system having an exhaust.

FIG. 18 shows the simulated deposition profile for five nozzles depositing three materials at nozzle-substrate separations of 10 and 20 microns, with an exhaust between each pair of adjacent nozzles. The simulation assumed a background pressure of 133 Pa and a nitrogen carrier gas with an inlet flow rate of $6.5 \times 10^{-5}$ sccm (which corresponds to a velocity of about 1.0 m/s). For the simulated materials, the reduced mass was assumed to be the same for all diffusivities. The deposition profile shows simulated deposition of Materials 1, 2 and 3 at separations of 10 microns (1811, 1821, 1831, respectively) and 20 microns (1812, 1822, 1832, respectively). These results indicate that minimizing the separation distance may minimize the FWHM of deposited material, and suggest that a larger spacing between nozzles may be desirable.

Figure 19:
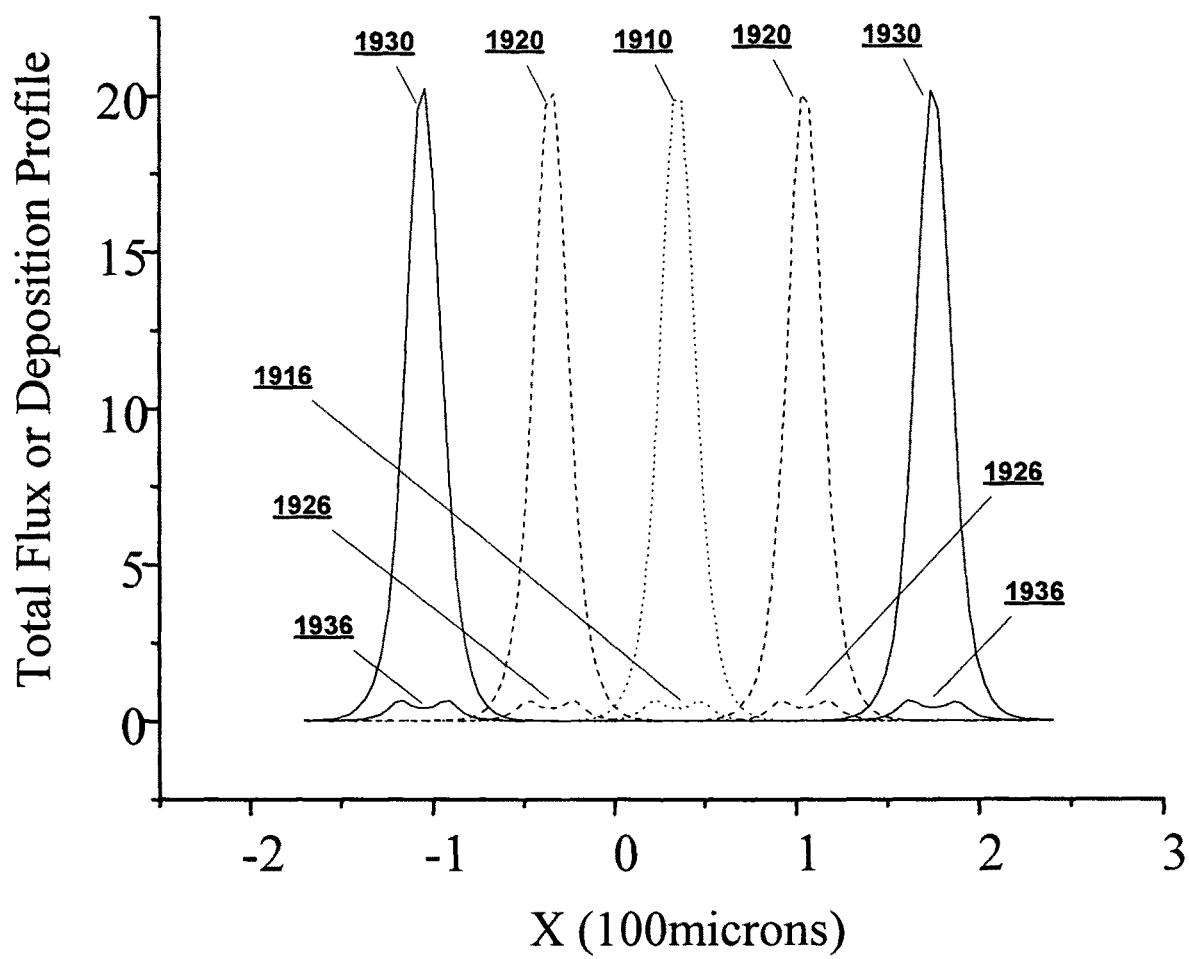
FIG. 19 shows simulation results for a multi-nozzle system with an exhaust between adjacent nozzles for various flow rates.

FIG. 19 shows a simulation of a multi-nozzle system with an exhaust between adjacent nozzles for flow rates corresponding to velocities of 1.0 m/s and 1000 m/s. The simulation assumed a background pressure of 133 Pa and constant reduced masses across all diffusivities. Deposition profiles are shown for Materials 1, 2 and 3 at flow rates of $6.5 \times 10^{-3}$ sccm (1910, 1920, 1930, respectively) and $6.5 \times 10^{-6}$ sccm (1916, 1926, 1936, respectively). These flow rates correspond to a nozzle velocity of 1000 m/s and 1.0 m/s, respectively. The results shown in FIG. 19 indicate that in the multi-nozzle system with exhaust, higher deposition rates generally lead to less desirable deposition profiles.

Figure 20:
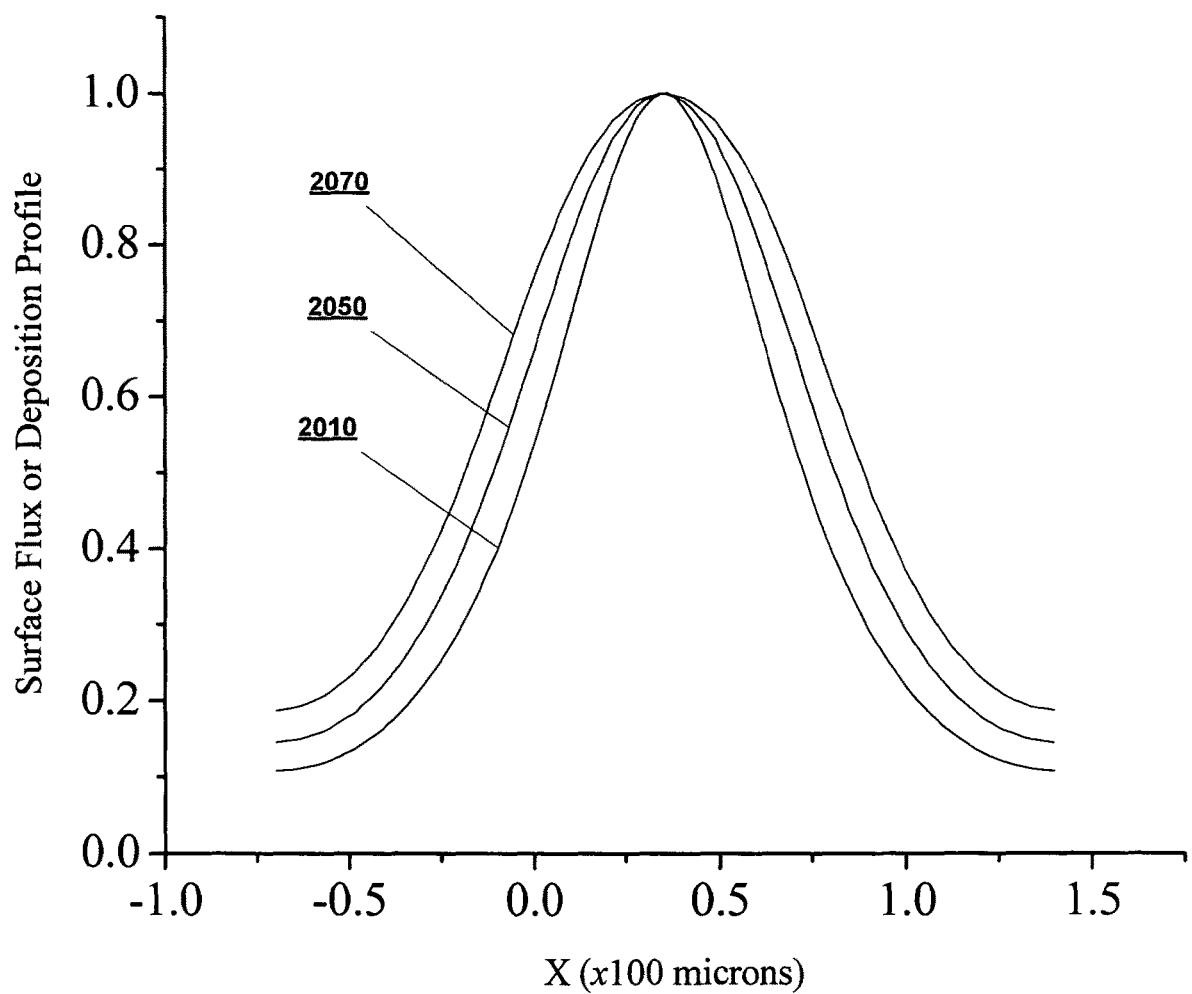
FIG. 20 shows simulated deposition profiles for a single nozzle of varying diameter.
Figure 21:
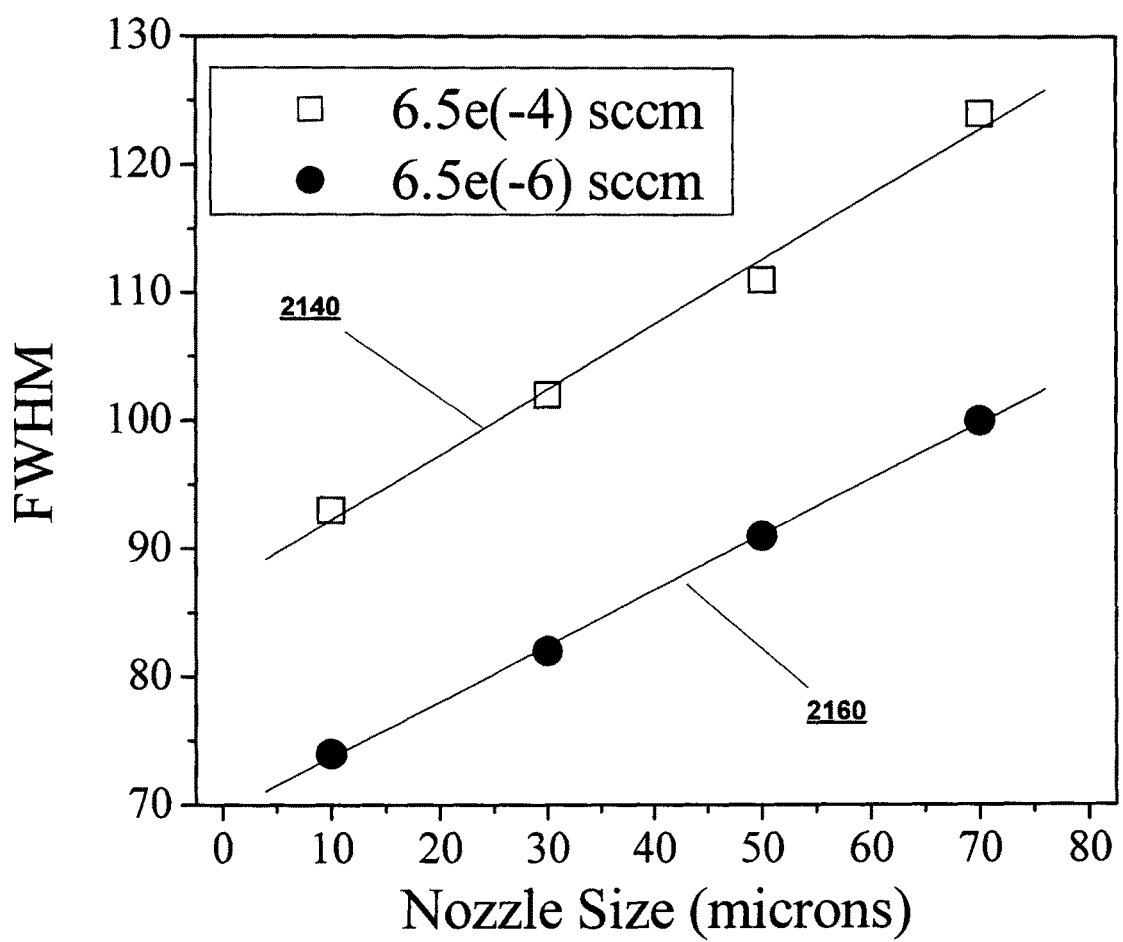
FIG. 21 shows the FWHM of deposited materials for the same simulation as FIG. 20.
Figure 22A:
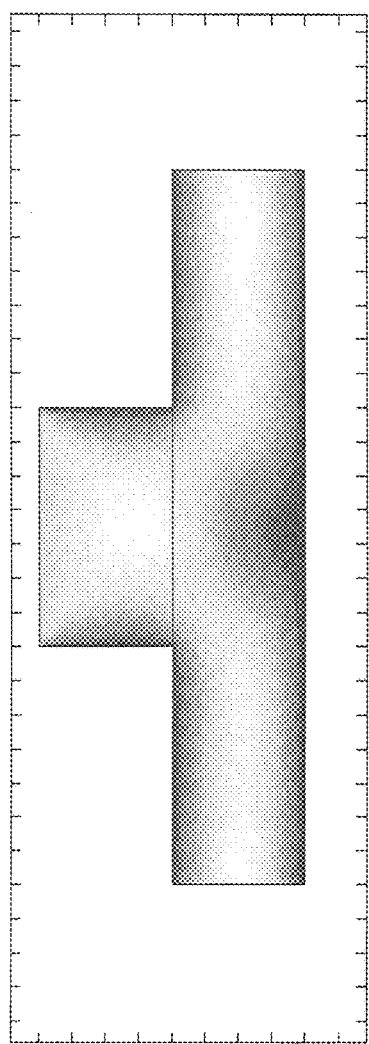
FIGS. 22A-22D show the velocity, pressure, temperature, and total flux, respectively, for a single-nozzle simulation.
Figure 22A:
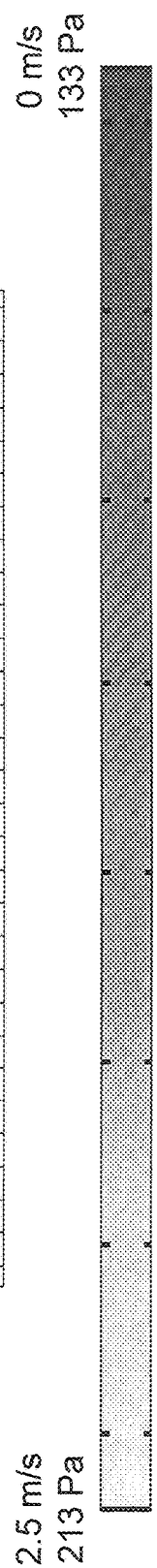
Figure 22B:
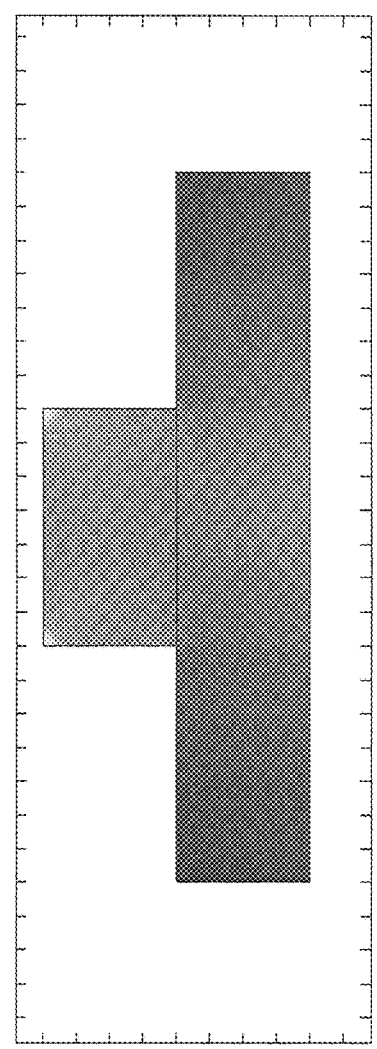
Figure 22B:
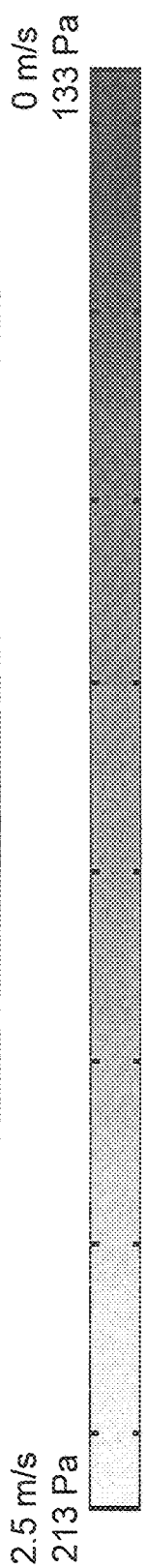
Figure 22C:
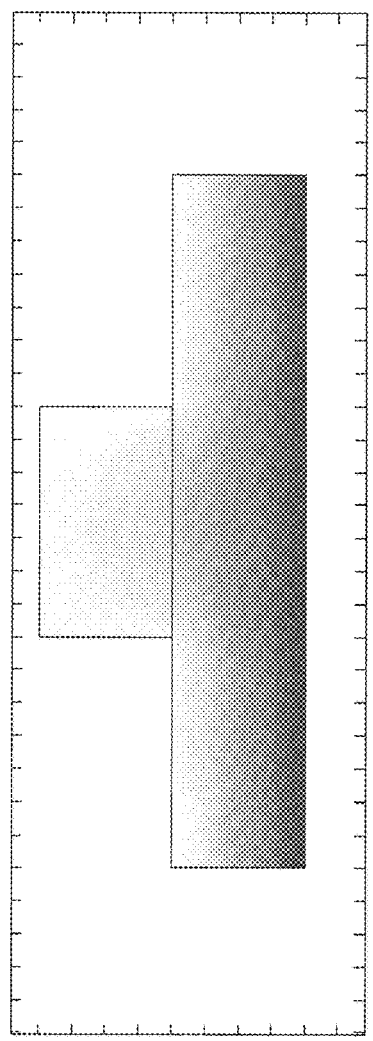
Figure 22C:
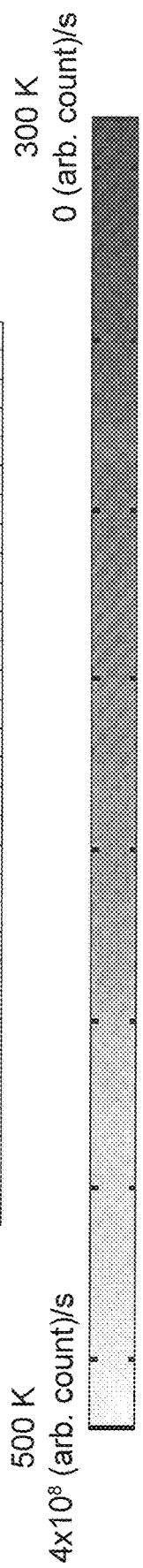
Figure 22D:
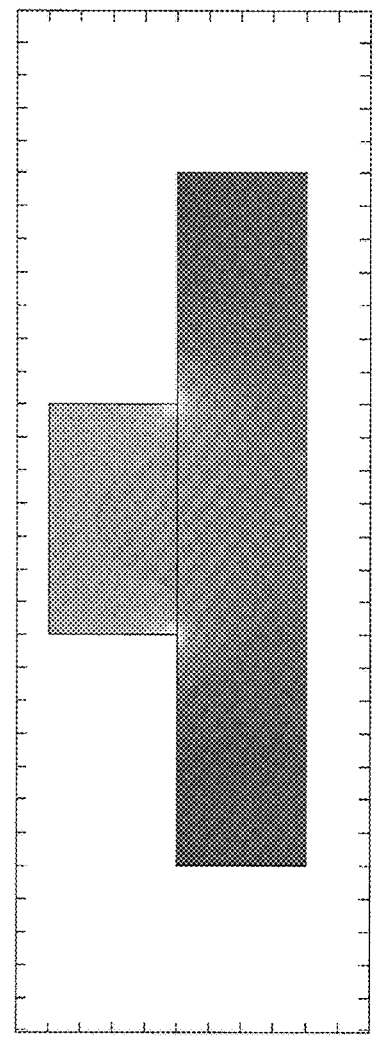
Figure 22D:
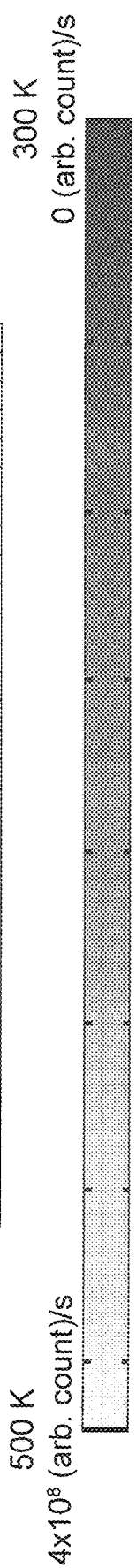

FIG. 20 shows the deposition profiles for a single nozzle of varying diameter at a background pressure of 133 Pa and a flow rate corresponding to a velocity of 1.0 m/s. Deposition profiles for nozzle diameters of 10 microns (2010), 50 microns (2050), and 70 microns (2070) are shown. FIG. 21 shows the FWHM of deposited material for the nozzle sizes of 10, 30, 50, and 70 microns at flow rates of $6.5 \times 10^{-4}$ sccm (2140) and $6.5 \times 10^{-6}$ sccm (2160), which correspond to nozzle velocities of 100 m/s and 1.0 m/s, respectively. The results illustrated in FIGS. 20-21 indicate that an increased nozzle size generally results in a decreased resolution, and higher flow rates may also decrease the resolution.

Figure 23:
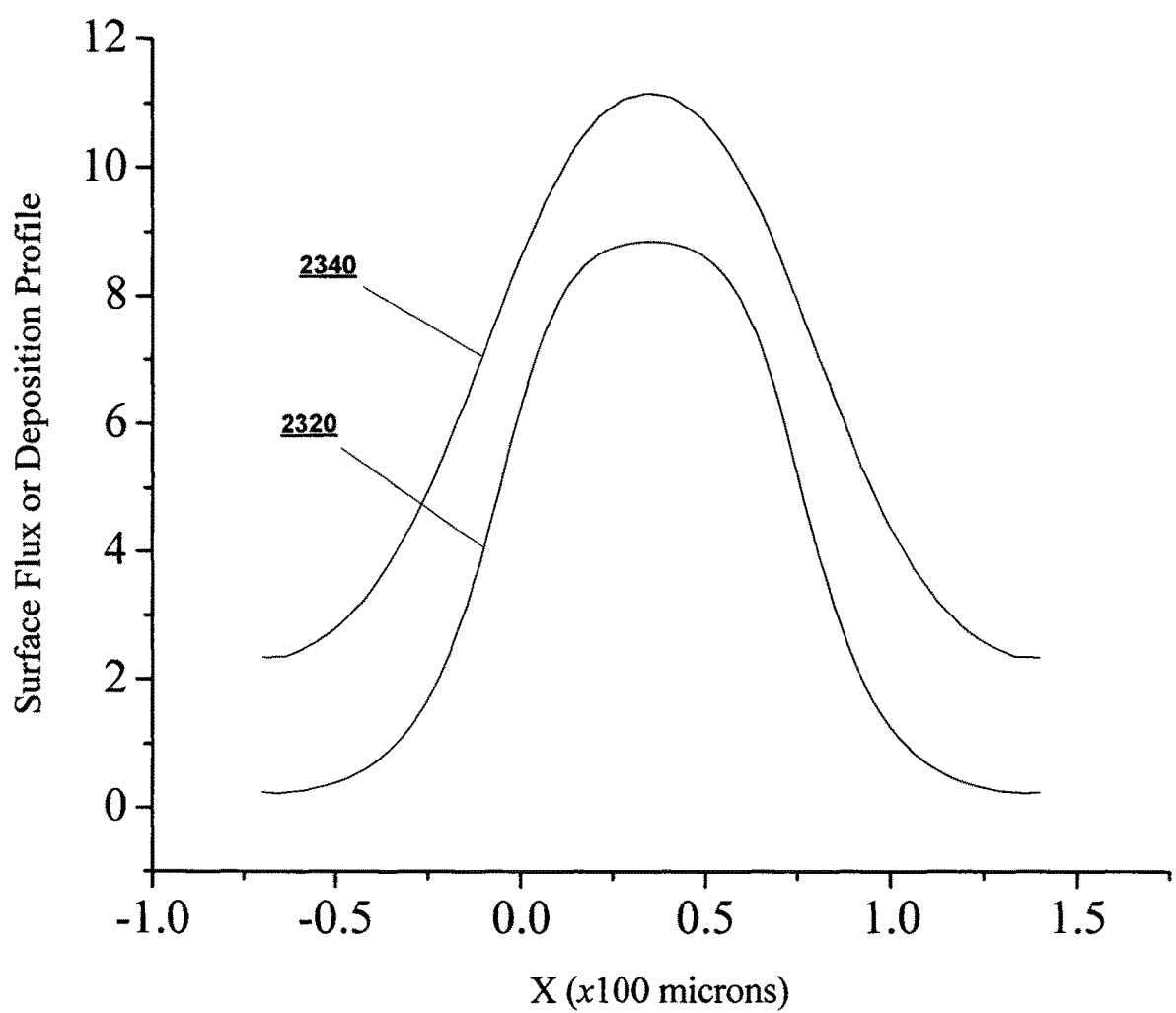
FIG. 23 shows the deposition profile for the same simulation as FIGS. 22A-22D at various nozzle-substrate separations.
Figure 24A:
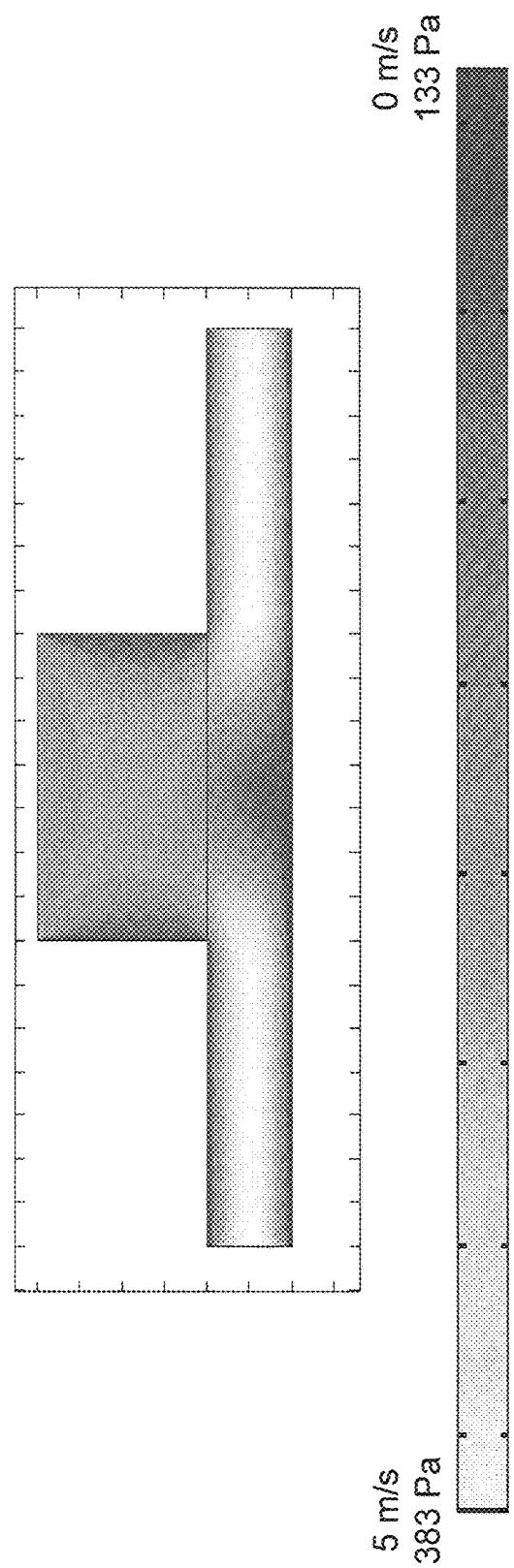
FIGS. 24A-24D show the velocity, pressure, temperature, and total flux, respectively, for a single-nozzle simulation.
Figure 24B:
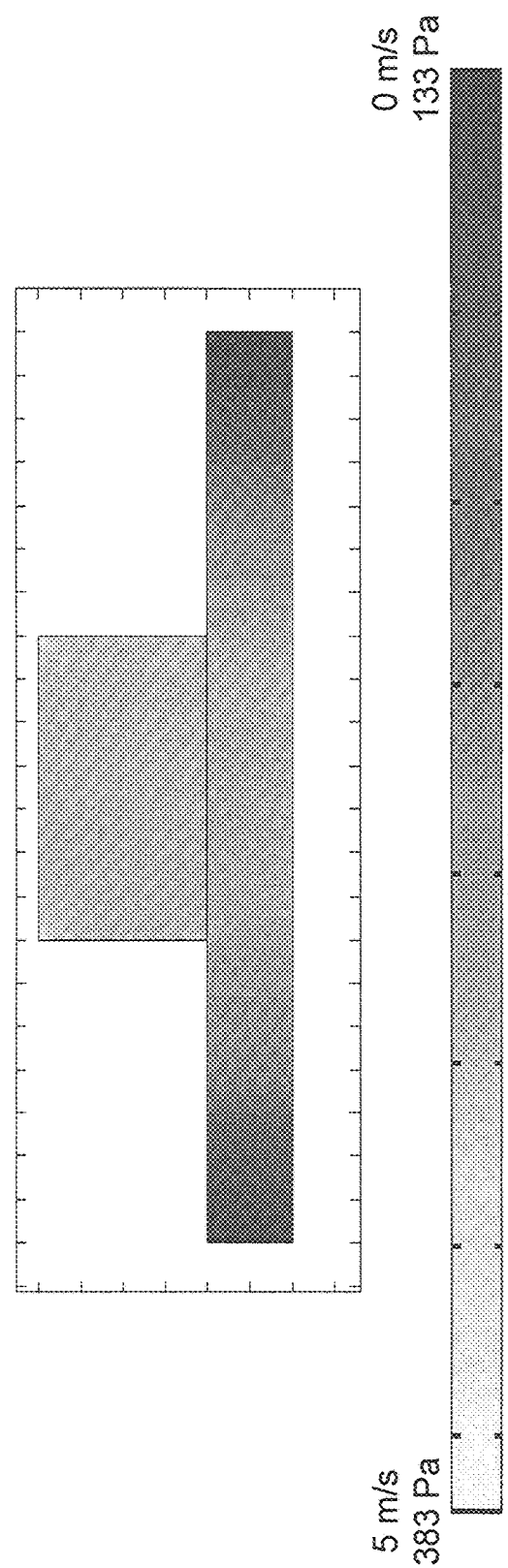
Figure 24C:
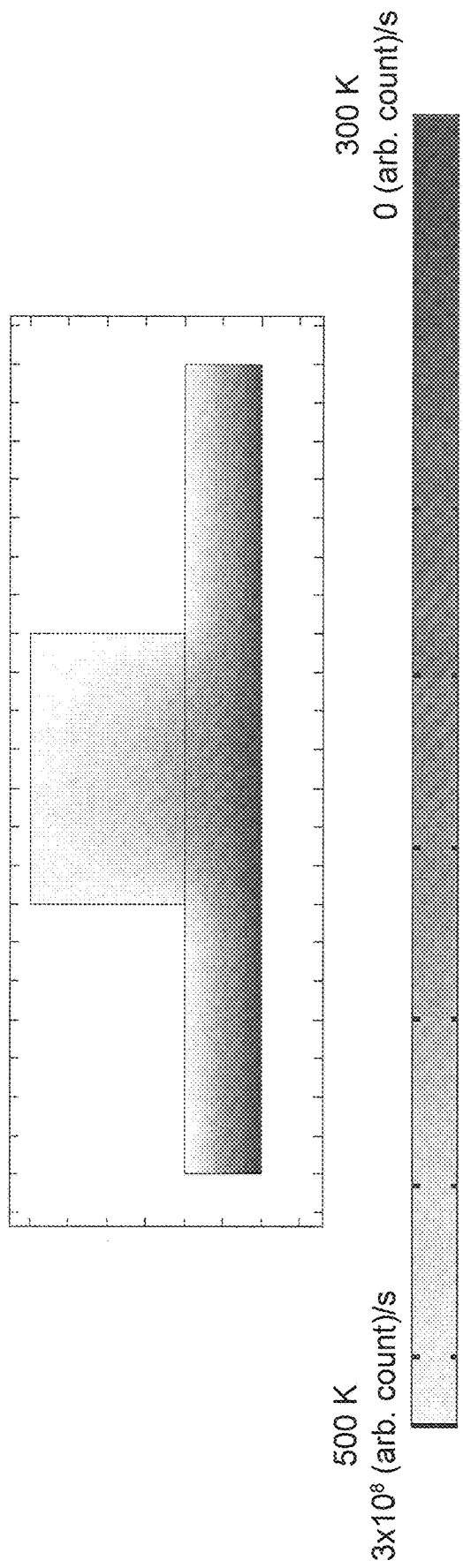
Figure 24D:
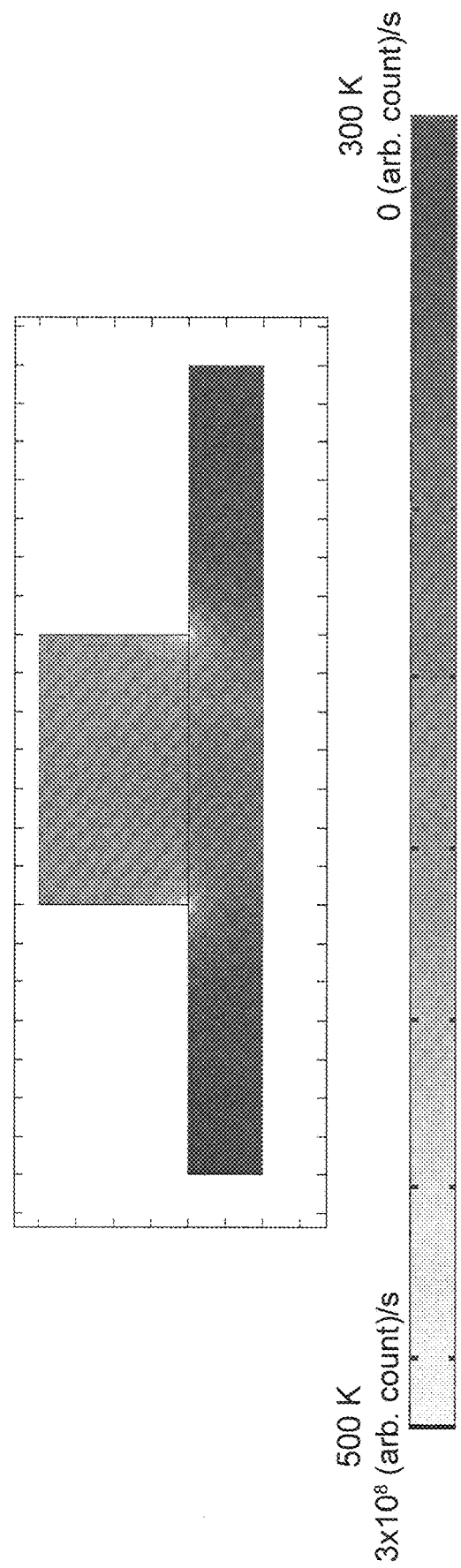

FIGS. 22A-22D show, respectively, the velocity, pressure, temperature, and total flux for a single nozzle with a 70 micron opening. The simulation assumed a background pressure of 133 Pa and a flow rate of $6.5 \times 10^{-4}$ sccm, which corresponds to a velocity of 100 m/s. FIG. 23 shows the deposition profile for the same simulation at nozzle-substrate separations of 20 microns (2320) and 40 microns (2340). The simulation results indicate that in a single nozzle system, a smaller substrate-nozzle separation may provide better resolution and a sharper deposition shape.

FIGS. 24A-24D show, respectively, the velocity, pressure, temperature, and total flux for a single nozzle with a 70 micron opening at a nozzle-substrate separation of 20 microns. The simulation assumed a background pressure of 133 Pa and a flow rate of $6.5 \times 10^{-4}$ sccm, which corresponds to a velocity of 100 m/s.

The simulation results described above indicate that the maximum resolution in an OVJD system may be achieved at the minimum nozzle-substrate separation. The resolution of the deposited layer may be increased by use of a relatively low carrier gas flow rate. At the low flow rates believed to be desirable in achieving a high resolution, the carrier gas goes not play a large role in the deposition profile. For example, the molecular weight of the carrier gas generally does not influence the deposition profile. The results further indicate that providing an exhaust between adjacent nozzles can improve the deposition profile and resolution of the deposited layer.

Although the simulations shown above are for a linear, one-dimensional array of nozzles, the results generalize to any nozzle array. For example, the linear multi-nozzle simulations provide the exact results for an annular array (i.e., an array formed by rotation of the linear array around the center nozzle). The results also provide at least a first-order approximation of the results that would be expected for a rectangular array, and it is believed that the simulations accurately predict deposition profile and resolution trends for any arbitrary nozzle array.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:
1. A system comprising:
   a substrate;
   a plurality of nozzles each having an outlet disposed over the substrate, each of the plurality of nozzles in fluid communication with a source of non-reactive carrier gas adapted to carry organic semiconductor material through the nozzle to the substrate;
   the plurality of nozzles comprising a first nozzle in fluid communication with a first organic semiconductor material to be deposited on the substrate and a second nozzle in fluid communication with a second organic semiconductor material, to be deposited on the substrate; and
   an exhaust having an inlet disposed directly adjacent to the first nozzle and the second nozzle;
   wherein the inlet of the exhaust is separated from the substrate by a first distance that is greater than a second distance between the first and second nozzle outlets and the substrate, and wherein the nozzles have an external surface with a first cross-sectional area at the first distance from the substrate, and a second, smaller cross-sectional area at the outlet of the nozzles;

wherein the system is configured to deposit the first organic semiconductor material from the first nozzle and the second organic semiconductor material from the second nozzle;

wherein the exhaust is configured to create an adjustable, localized vacuum in the volume formed between the external surfaces of the first nozzle and the second nozzle.

2. The system of claim 1, further comprising a vacuum chamber in which the plurality of nozzles is disposed, wherein the exhaust is configured to be in fluid communication with an ambient vacuum within the vacuum chamber.

3. The system of claim 1, further comprising a plurality of exhausts, each exhaust disposed between the first nozzle of the plurality of nozzles and each other nozzle of the plurality of nozzles that is directly adjacent to the first nozzle.

4. The system of claim 1, wherein the substrate is separated from the plurality of nozzles by 2 microns to 20 microns.

5. The system of claim 1, wherein the substrate is separated from the plurality of nozzles by 0.2 microns to 10 microns.

6. The system of claim 1, wherein each of the plurality of nozzles comprises an opening of 2 microns to 50 microns in diameter from which carrier gas is ejected.

7. The system of claim 1, wherein each of the plurality of nozzles comprises an opening of 0.2 microns to 10 microns in diameter from which carrier gas is ejected.

8. The system of claim 1, wherein each of the plurality of nozzles comprises a nozzle opening with a diameter (d); the nozzles are separated from the substrate by a distance (s); and the ratio d:s is 1.0 to 2.5.

9. The system of claim 1, wherein the nozzles are disposed in a nozzle block.

10. The system of claim 9, wherein the exhaust is disposed closer to the center of the nozzle block than at least one of the plurality of nozzles.

11. The system of claim 9, wherein the nozzle block is a one-dimensional linear nozzle block.

12. The system of claim 9, wherein the plurality of nozzles are arranged in a two-dimensional array.

13. The system of claim 9, wherein the nozzle spacing is 50 microns to 100 microns.

14. The system of claim 1, further comprising an exhaust disposed between each pair of adjacent nozzles in the plurality of nozzles.

15. The system of claim 1, wherein at least two of the plurality of nozzles is in fluid communication with a common source of organic semiconductor material to be deposited on the substrate.

16. The system of claim 1, wherein the system is configured to deposit a pattern of the first and second organic semiconductor material, the pattern including separate elements substantially corresponding to an arrangement of the first nozzle and the second nozzle.

17. The system of claim 1, wherein the system is configured to deposit the first and second organic semiconductor material simultaneously from the first nozzle and the second nozzle.

18. The system of claim 1, wherein the system is configured to eject the carrier gas from the plurality of nozzles with a velocity of less than 100 m/s.

19. An organic vapor jet deposition system comprising:
a first source of a first organic semiconductor material and a second source of a second organic semiconductor material;

a source of non-reactive carrier gas adapted to carry the first and second organic semiconductor material;

a plurality of nozzles, each having an outlet, disposed in a nozzle block, each of the plurality of nozzles in fluid communication with the source of carrier gas; and an exhaust having an inlet, disposed in the nozzle block, directly adjacent to a first nozzle of the plurality of nozzles and to a second nozzle of the plurality of nozzles;

wherein the exhaust is configured to create an adjustable, localized vacuum in an volume formed between external surfaces of the first nozzle and the second nozzle;

wherein the system is configured to carry the first organic semiconductor material through the first nozzle via the carrier gas and the second organic semiconductor material through the second nozzle via the carrier gas to a substrate;

wherein the inlet of the exhaust is separated from the substrate by a first distance that is greater than a second distance between the first and second nozzle outlets and the substrate, and wherein the external surfaces of the nozzles each have a first cross-sectional area at the first distance from the substrate, and a second, smaller cross-sectional area at the outlets of the nozzles.

20. The system of claim 1, the plurality of nozzles further comprising a third nozzle in fluid communication with a third organic semiconductor material and the exhaust having a second inlet positioned directly adjacent to the second nozzle and the third nozzle;

wherein the first, second, and third organic semiconductor materials are red, green, and blue emissive organic semiconductor materials, respectively.

21. The system of claim 1, wherein the first and second organic semiconductor materials are selected from the group consisting of a red emissive organic semiconductor material, a green emissive organic semiconductor material, and a blue emissive organic semiconductor material.

22. The system of claim 1, wherein the first organic semiconductor material has a different chemical composition from the second organic semiconductor material.

23. The system of claim 1, configured to deposit the first organic semiconductor material and the second organic semiconductor material at a flow rate of less than $6.5 \times 10^1$ sccm at a background pressure of less than 283 pascals.

24. The system of claim 1, wherein each nozzle of the plurality of nozzles is configured to deposit a pixel of an organic semiconductor material, each pixel having a full-width at half maximum of 74 microns to 125 microns.

25. The system of claim 19, wherein the system is configured to eject the carrier gas from the plurality of nozzles with a velocity of less than 100 m/s.

26. The system of claim 19, wherein the first organic semiconductor material is an emissive material.

27. The system of claim 19, wherein the system is configured to directly deposit the first and second organic semiconductor material from the first nozzle and the second nozzle in a final pattern including separate elements substantially corresponding to an arrangement of the first and second nozzles.

28. The system of claim 19, wherein the first organic semiconductor material has a different chemical composition from the second organic semiconductor material.

* * * * *

UNITED STATES PATENT AND TRADEMARK OFFICE
CERTIFICATE OF CORRECTION

PATENT NO. : 11,374,172 B2  
APPLICATION NO. : 12/974070  
DATED : June 28, 2022  
INVENTOR(S) : Stephen R. Forrest and Richard Lunt Page 1 of 1

It is certified that error appears in the above-identified patent and that said Letters Patent is hereby corrected as shown below:

In the Claims

Column 16, Lines 43-46 should read:
23. The system of claim 1, configured to deposit the first organic semiconductor material and the second organic semiconductor material at a flow rate of less than $6.5 \times 10^{-4}$ sccm at a background pressure of less than 283 pascals.

Signed and Sealed this  
Twenty-second Day of November, 2022

Katherine Kelly Vidal  
*Director of the United States Patent and Trademark Office*